(12) United States Patent
Primavera et al.

(10) Patent No.: US 7,388,394 B1
(45) Date of Patent: Jun. 17, 2008

(54) MULTIPLE LAYER PRINTED CIRCUIT BOARD HAVING MISREGISTRATION TESTING PATTERN

(75) Inventors: Anthony A. Primavera, Anoka, MN (US); Orrin P. Lorenz, Anoka, MN (US); Howard L. Bentley, Columbia Heights, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 31 days.

(21) Appl. No.: 11/001,903

(22) Filed: Dec. 1, 2004

(51) Int. Cl.
*G01R 31/26* (2006.01)
*G01R 31/28* (2006.01)

(52) U.S. Cl. ..................... 324/765; 324/158.1

(58) Field of Classification Search ............... None
See application file for complete search history.

(56) References Cited

U.S. PATENT DOCUMENTS

| | | | |
|---|---|---|---|
| 3,859,711 A * | 1/1975 | McKiddy | 29/593 |
| 4,012,693 A | 3/1977 | Sullivan | |
| 4,894,606 A * | 1/1990 | Paur | 327/73.1 |
| 4,918,380 A | 4/1990 | Paur | |
| 5,204,912 A | 4/1993 | Schimanski | |
| 6,137,297 A | 10/2000 | McNair et al. | |
| 6,388,208 B1 * | 5/2002 | Kiani et al. | 174/266 |
| 6,483,938 B1 | 11/2002 | Hennessey et al. | |

* cited by examiner

*Primary Examiner*—Ha Tran Nguyen
*Assistant Examiner*—Roberto Velez
(74) *Attorney, Agent, or Firm*—Faegre & Benson, LLP

(57) ABSTRACT

A method of testing for misregistration in a multiple layer printed circuit board includes providing an electrical test pattern on one or more layers of the board, testing for an electrical signal between the test pattern and a test reference, and determining layer-to-layer misregistration based on the results of the testing. A method of manufacturing a multiple layer board that is configured to facilitate non-destructive testing of layer-to-layer misregistration includes forming an electrical test pattern on a first layer and forming a corresponding electrical test reference on a second layer. Then, a connecting pathway is formed between the test reference and the test pattern, including the first and second layers, with testing for an electrical signal between the test reference and the test pattern determining layer-to-layer misregistration of the first layer with respect to the second layer.

27 Claims, 31 Drawing Sheets

MULTIPLE LAYER PRINTED CIRCUIT BOARD HAVING MISREGISTRATION TESTING PATTERN

TECHNICAL FIELD

The present invention relates to multiple layer printed circuit board manufacture and testing, in particular, a non-destructive testing method and apparatus for determining layer-to-layer misregistration of the multiple layers of a circuit board.

BACKGROUND

The use of multiple layer printed circuit boards, (hereinafter "PCBs"), in electronic devices has become wide spread throughout many industries. As devices and their electrical components become ever smaller, the density of the components and their connecting leads on the layers of the PCBs has increased. In addition, the use of more layers has been necessary to appropriately connect the additional components.

Multiple layer PCBs are made one layer at a time and then sandwiched together. Usually, the layers are in registration with respect to each other within designated manufacturing tolerances. During manufacturing, however, there is opportunity for each layer to experience growth, shrinkage or warping due to material properties affected by the manufacturing processes. In addition, alignment tolerances and other quality control issues may affect the stacking and alignment of the layers. As a result, layer-to-layer misalignment may occur between two or more layers within the multiple layer PCB.

Connections between the layers are necessary and are usually provided by holes drilled through one or more layers and plated to supply the electrical connection. When the layers of a PCB are not aligned correctly, the plated connection holes, also known as vias, may not line up with corresponding sites on another layer. When the layer-to-layer registration is off by a large margin, the via may not connect to the intended site at all. During subsequent electrical testing of the PCB, the misregistration will be discovered based on an electrical conduction failure of the via. Catching faulty PCBs at this stage of the manufacturing process is relatively easy and less costly to correct.

When the layer-to-layer registration is off by a smaller margin, the via may have a slight electrical connection and, thus, pass the electrical testing. When this PCB subsequently undergoes further manufacturing or assembly processes, the inadequate electrical connection may then cause a failure in the board. Failure at this stage of manufacturing or assembly is more costly, due to the added time and labor input into the formation of the PCB.

In some situations, the misregistration of the layers may cause a misalignment situation wherein there is enough electrical connection provided to pass both electrical testing of the board and subsequent manufacturing and/or assembly processes. However, the inadequacy of the electrical connection has the potential for causing reliability problems, such as early failure of the PCB during its intended use. These types of failures can be extremely costly and potentially dangerous and, thus, should be avoided by being detected during the formation process.

Implantable medical devices, such as cardiac rhythm management devices (e.g., pacing systems and defibrillators) and a variety of implantable muscle or nerve stimulators, conventionally include a battery-powered electronic pulse generator coupled to an electronic circuit assembly contained within a sealed metal housing. The electronic circuit assembly typically comprises a plurality of interconnected PCBs that function to control the operation of the implantable device.

A significant concern for manufacturers of implantable electronic devices is ensuring an adequate level of quality control and reliability in the electronic circuit assembly, and in particular in the circuit boards. Therefore, the ability to quickly and easily verify the quality of each PCB is important. The ability to detect misregistration of layers at the PCB formation stage would improve both the quality and reliability of the PCBs, as well as decrease manufacturing costs.

SUMMARY

The present invention, in one embodiment, is a method of manufacturing a multiple layer printed circuit board configured to facilitate testing of layer-to-layer misregistration. The method includes the steps of forming an electrical test pattern having a plurality of test traces on a first layer, forming a corresponding electrical test reference on a second layer and coupling the first layer and the second layer to form the printed circuit board. In addition, forming an electrically conductive connecting pathway between the electrical test reference and the electrical test pattern, testing for an electrical continuity between the electrical test reference and each of the traces of the electrical test pattern and determining layer-to-layer misregistration of the first layer with respect to the second layer based on the electrical continuity.

The present invention, in another embodiment, is a multiple layer printed circuit board configured to facilitate non-destructive testing of layer-to-layer misregistration within the board. The board includes an electrical test pattern on a first layer of the multiple layer board, a corresponding electrical test reference on a second layer of the multiple layer board and a connecting pathway between the electrical test reference and the electrical test pattern. A test for misregistration between the first and second layers includes a test for an electrical continuity between the electrical test reference and the electrical test pattern.

The present invention, in yet another embodiment, is a method of testing for layer-to-layer misregistration in a multiple layer printed circuit board. The method includes the steps of providing an electrical test pattern on one or more layers of the multiple layer board, providing an electrical test reference with respect to one or more layers of the multiple layer board, providing at least one pathway connecting the test pattern and the test reference, testing for an electrical signal between the electrical test pattern and the test reference, and determining layer-to-layer misregistration based on the results of the electrical signal testing.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

In the attached Figures, like components are labeled with like numerals throughout the several Figures.

The present invention includes a method for providing inner and outer layer data concerning relative layer placement in a multiple layer PCB. The invention also includes a non-destructive testing apparatus for acquiring the inner and outer layer data and a data handling technique for calculating the amount, direction and orientation of layer-to-layer misregistration after formation of the PCB.

Figure 1:
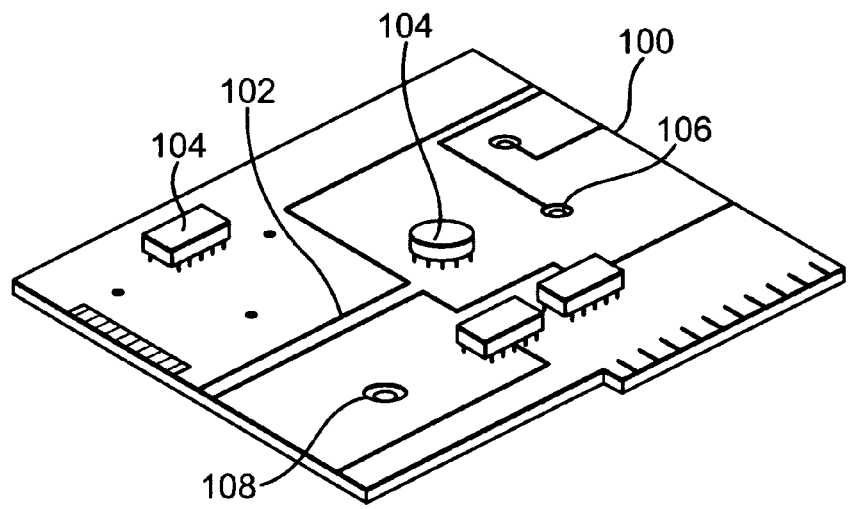
FIG. 1 is a perspective view of a standard, prior art multiple layer printed circuit board (PCB)

FIG. 1 illustrates a general view of a multiple layer printed circuit board ("PCB") 100, including a plurality of electrical traces or leads 102, electrical components 104 and connecting features 106. A layer in a PCB includes an electrically isolated surface on which electrical traces, components and/or connections are formed or placed.

As described in the Background section, PCB layers are typically placed into electrical contact by various types of holes formed between the layers. There are commonly four main types of holes, including: plated through-holes ("PTH"), which are drilled completely through the PCB, metallized and then connect any of the layers; non-plated through-holes ("NPTH"), which are drilled completely through the PCB but are not metallized; blind vias, which connect two adjacent layers, can terminate at an electrical stop or capture pad and are drilled and metallized after lamination of the PCB; and buried vias, which are drilled and metallized between inner layers before lamination of the PCB. In FIG. 1, one connecting feature 106 is a plated through-hole or PTH 108.

Figure 2:
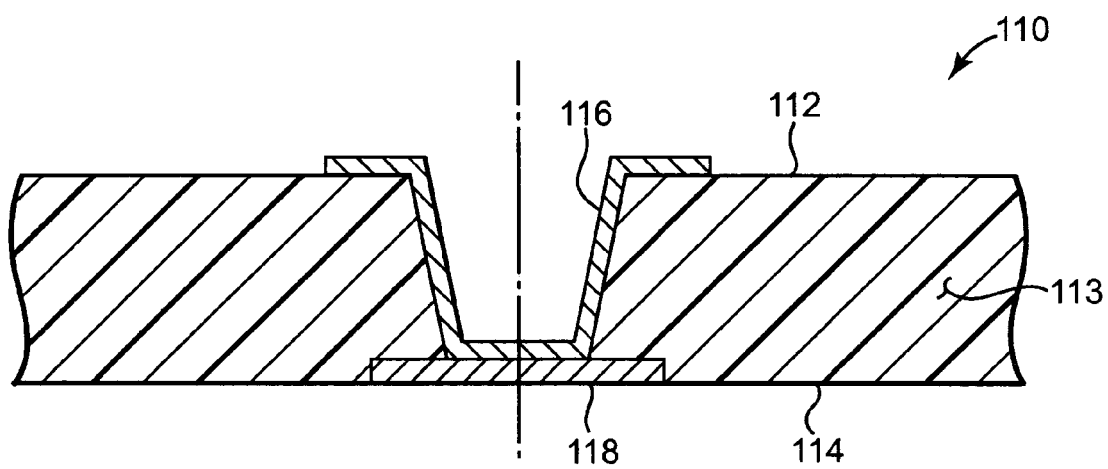
FIG. 2 is a cross-sectional representation of a plated blind via in a two layer PCB in proper alignment.

In FIG. 2, a cross-section of a two-layer PCB 110 is shown having a first surface, or first layer 112, and a second surface, or second layer 114, separated by an electrically isolating portion 113. A blind via 116 is included to pass from the first layer 112 to the second layer 114. A stop or capture pad 118 is provided in the second layer 114 in an appropriate location, such that the blind via 116 makes contact with the capture pad 118 to provide an electrical connection between the first and second layers, 112, 114. The blind via 116 should be aligned with the capture pad 118 to provide full electrical contact.

Figure 3:
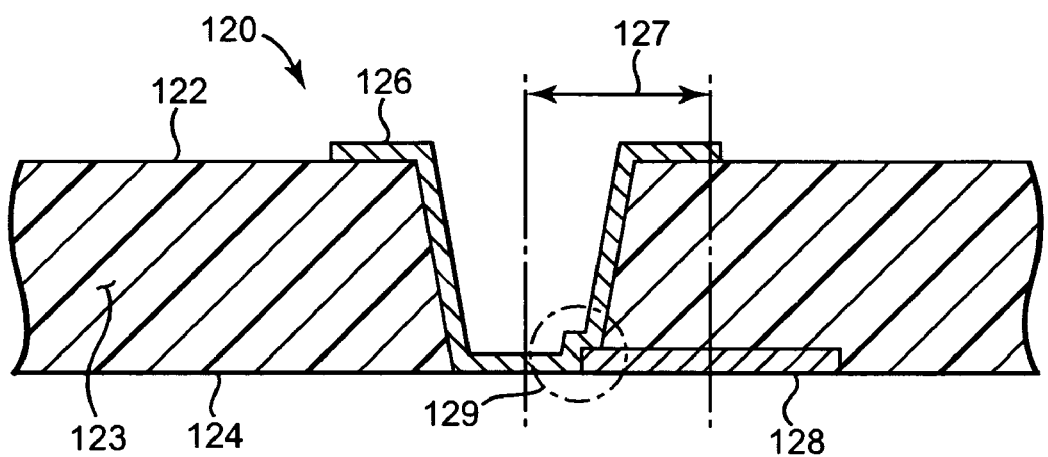
FIG. 3 is a first cross-sectional representation of a plated blind via in a two layer PCB showing misregistration between the two layers.

Due to normal manufacturing processes, however, it is not uncommon that the first layer 112 and the second layer 114 are misregistered to some degree so that the blind via 116 and capture pad 118 are not aligned. In FIG. 3, another two-layer PCB 120 is shown having a first layer 122 and a second layer 124 separated by an electrically isolating portion 123. A plated blind via 126 is provided between these two layers, 122 and 124. A capture pad 128 is also provided for contact with the via 126. In this PCB 120, however, the first layer 122 is misregistered from the second layer 124 resulting in a misalignment between the via 126 and the capture pad 128. This misalignment distance 127 is referred to as a registration error. As shown, the registration error 127 causes a minimal amount of electrical contact, at the contact area 129, between the via 126 and the capture pad 128. For smaller registration errors 127, the contact area 129 would increase. For larger registration errors 127, the contact area 129 would decrease and ultimately result in zero contact between the via 126 and the capture pad 128.

Figure 4:
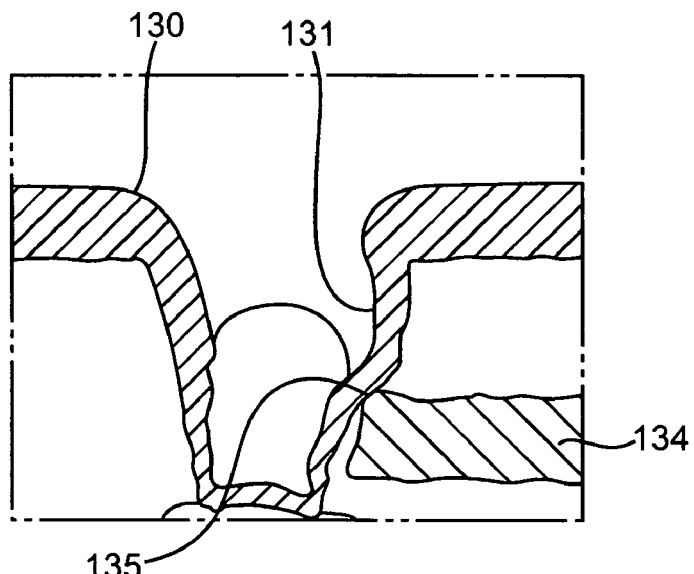
FIG. 4 is a second cross-sectional representation of a plated blind via between two layers of a PCB showing misregistration between the two layers.
Figure 5:
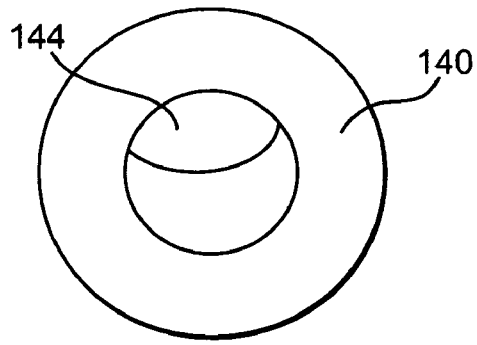
FIG. 5 is a top, planar view of a plated through-hole in a PCB showing misregistration between two layers.

In FIGS. 4 and 5, additional misregistration examples are shown. In FIG. 4, a plated blind via 130 and a capture pad 134 are shown. The via 130 should have been formed on top of and centered over the capture pad 134. However, misregistration of the layers resulted in a shift of the via 130 with respect to the pad 134. In this example, a side wall 131 of via 130 makes contact with a corner 135 of pad 134. This minimal amount of electrical contact would allow the via 130 to pass basic continuity testing, but the via 130 would ultimately fail during assembly or post-assembly processes, or would not have the durability required of a quality product. In FIG. 5, a top view of a plated blind via 140 is shown formed with respect to a capture pad 144. The via 140 is shifted off of center of the pad 144, thereby reducing the amount of material in electrical contact.

In the examples described above, the misregistration of the first and second layers causes a registration error of some degree. However, electrical contact between each blind via and capture pad does occur. Therefore, during electrical testing by continuity measurement, this type of misaligned feature would pass the test and the PCB would move on for further manufacturing or assembly processes. Only in the situation where the registration error was large enough to provide zero electrical contact would the feature fail the continuity test so that the PCB was scrapped at this stage of the manufacturing process.

Unfortunately, however, such misaligned features caused by misregistration of the PCB layers may fail to withstand further manufacturing and/or assembly processes, such as the mounting of electronic components through a PTH or into a blind via. Alternatively, these misaligned features may fail unacceptably during usage of the PCB resulting in poor reliability, unnecessary damage, dangerous conditions and/or costly repair or replacement. Testing methods and equipment for determining layer-to-layer misregistration during the earlier stages of PCB manufacturing and assembly, when scrap costs and rework costs are less expensive, would be beneficial to all PCB manufacturers and users.

Since many registration errors occur between intermediate layers of a multiple layer PCB, such misregistration, as shown and described above, between the two layers would not normally be perceivable visually. The use of destructive testing to check for non-visually perceivable misregistration and other internal errors would normally be necessary for quality control purposes.

Figure 6:
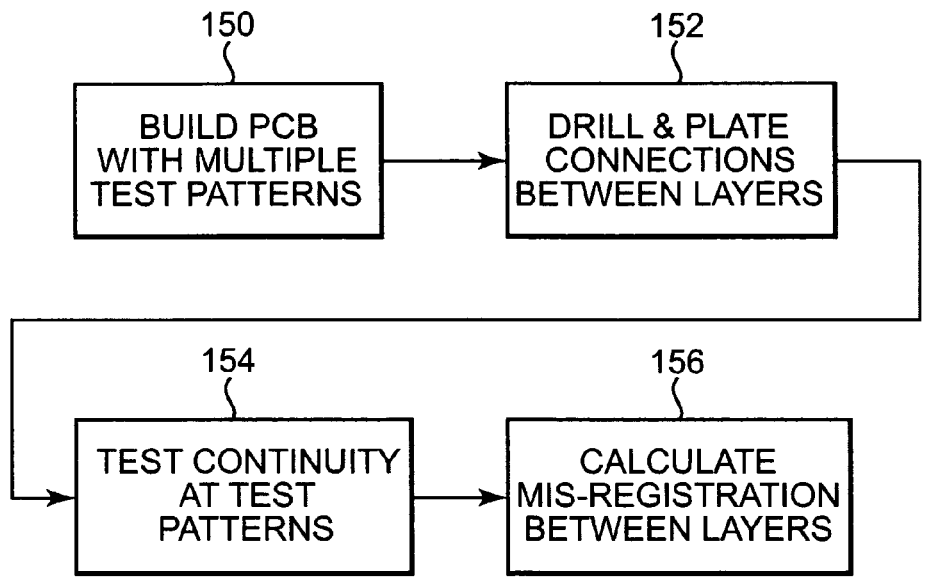
FIG. 6 is flow chart of the basic steps of the present invention.

In general, as shown by flow chart in FIG. 6, the method of the present invention includes the creation of one or more test patterns on the PCB (Block 150), including test pattern features created on each layer of the PCB during standard manufacturing formation of the PCB. At least one layer of each test pattern is configured to serve as an electrical test reference from which misregistration will be determined. After board formation, electrically conductive connecting pathways formed as electrical connections through the layers, between the test reference and the test patterns, are formed (Block 152), usually by drilling and plating through-holes. A testing apparatus or other type of electrical probing then checks for and records continuity between the test pattern features on the layers of the PCB (Block 154). Finally, a data handling and manipulation program analyzes the recorded data to calculate misregistration between the layers of the PCB (Block 156), including quantification of the amount and direction of such misregistration, if desired. Each of these steps will be discussed in detail below.

Figures 7, 8:
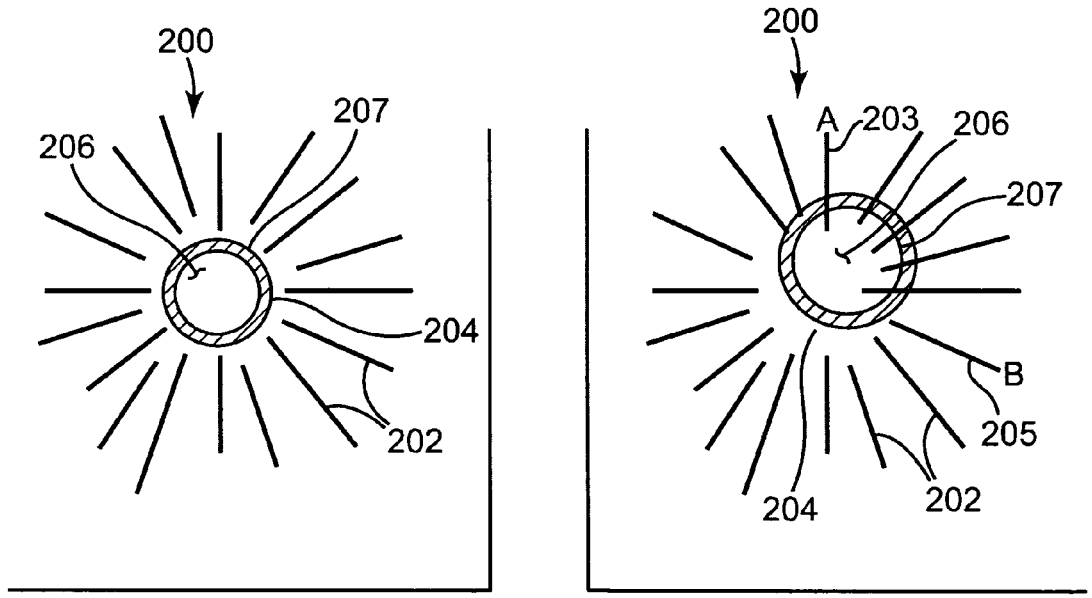
FIG. 7 is a planar representation of a first embodiment of an electrical test pattern of the present invention for use in determining layer-to-layer misregistration, including a plurality of radiating electrical traces about a plated through-hole shown in proper alignment.
FIG. 8 is the test pattern of FIG. 7 in which the layers are in misregistration and the plated through-hole is misaligned with respect to the radiating traces.

In FIGS. 7 and 8, one embodiment of a method for acquiring inner layer data to determine layer-to-layer misregistration includes an electrical test pattern 200 formed on a first layer of a multiple layer PCB. The test pattern 200 includes a plurality of radiating electrical traces 202 that encircle a through-hole site 204. A PTH 206 is provided from a second layer of the PCB at a location corresponding to the through-hole site 204 and serves as an electrical test reference from the second layer. When the first and second layers of the PCB are generally aligned, or in proper registration as shown in FIG. 7, the plating 207 of the PTH 206 does not contact any of the traces 202 of the test pattern 200. Therefore, electrical contact between the PTH 206 and the traces 202 does not occur and electrical continuity between the PTH 206 and the traces 202, or between two or more traces 202, is not created. A subsequent electrical test of the PTH 206 with respect to the traces 202, or between two or more traces 202, would fail to show electrical continuity, thereby indicating that the first and second layers of the PCB were in acceptable registration with respect to each other in an area surrounding the test pattern 200.

When the first and second layers of the PCB are misregistered as shown in FIG. 8, the plating 207 of the PTH 206 contacts one or more of the plurality of electrical traces 202. Not only is there electrical contact between the PTH 206 and traces 202, but also between two or more traces 202 of the pattern 200. During a subsequent electrical test between the test pattern 200 and the reference, PTH 206, the electrical contact between the PTH 206 and traces 202, or between two or more traces 202, will indicate continuity and, thus, a misregistration with respect to the first and second layers of the PCB. Optionally, by monitoring which traces 202 in the pattern 200 are in electrical contact or continuity, an indication of the direction of misregistration may be determined. As shown, trace 'A' 203 is connected by the PTH 206 to trace 'B' 205, indicating a generally upward right shift (with respect to the pattern 200 as shown) between the two layers. This information may prove useful in determining the manufacturing error when forming the PCB.

Figure 9:
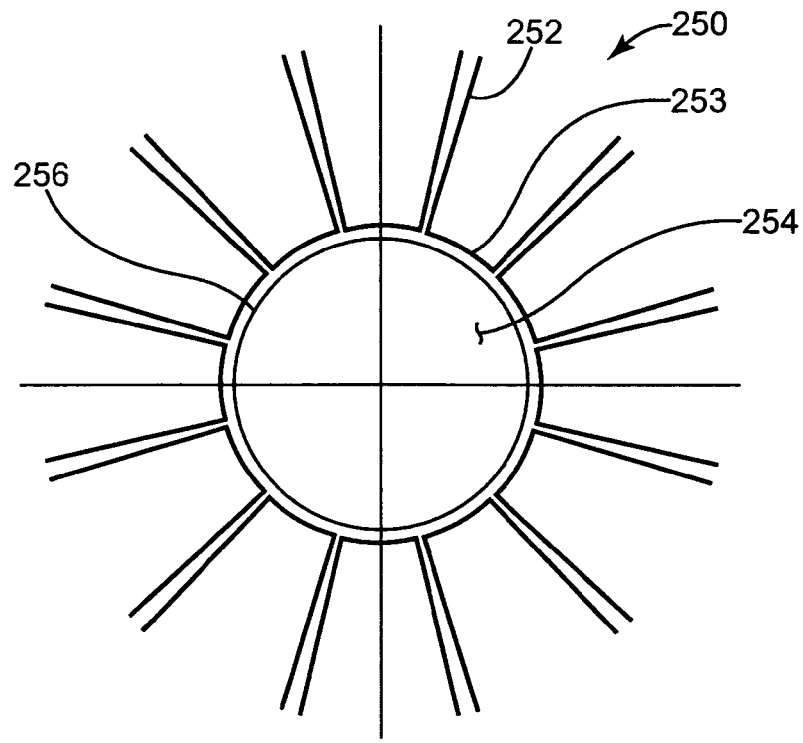
FIG. 9 is a planar representation of a second embodiment of a test pattern in accordance with the present invention, including a plurality of radiating electrical traces about a non-plated through-hole, shown in proper alignment.
Figure 10:
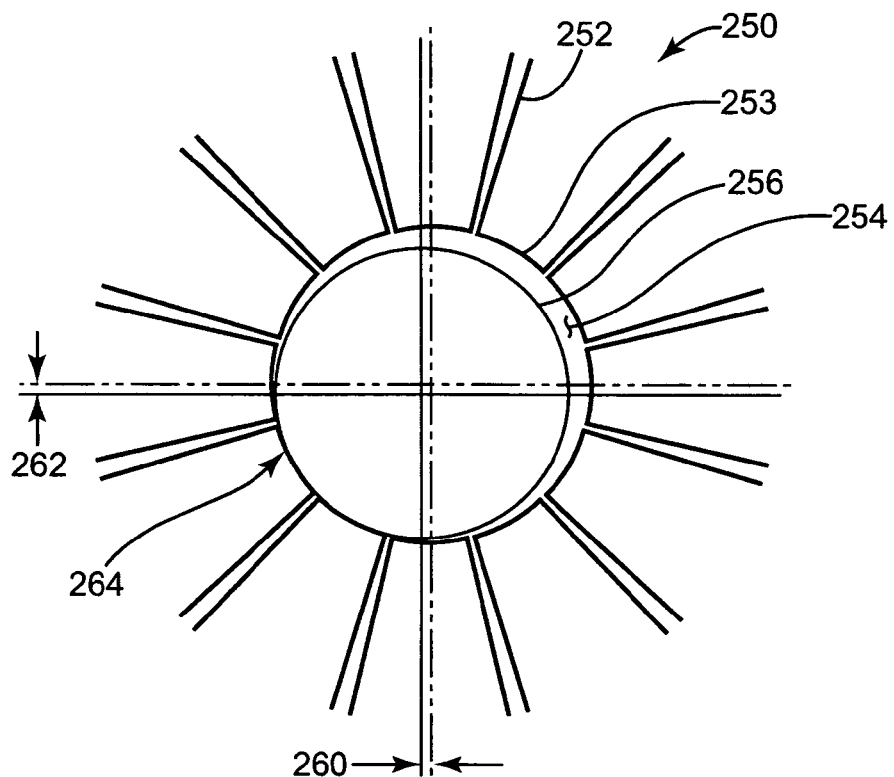
FIG. 10 is the test pattern of FIG. 9 in which the layers are in misregistration and the non-plated through-hole cuts through the electrical traces.
Figure 11:
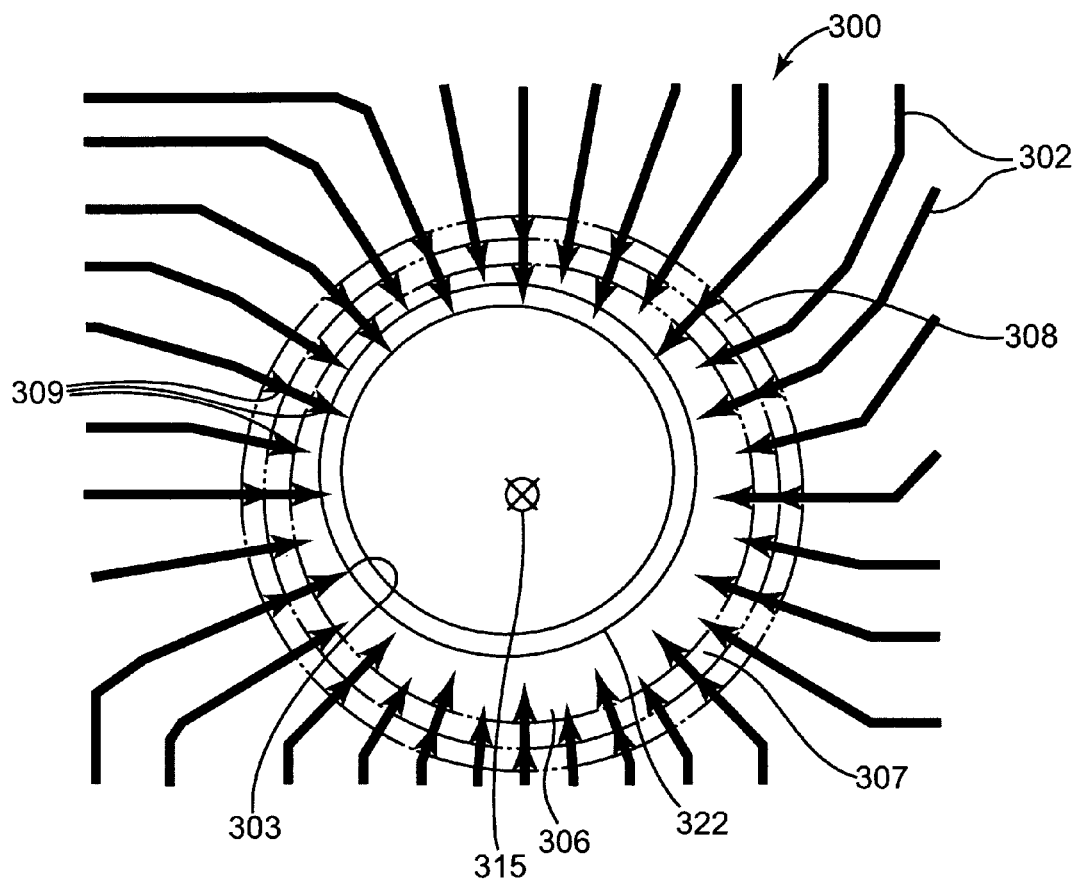
FIG. 11 is a detailed view of a third embodiment of a test pattern in accordance with the present invention depicting layer-to-layer misregistration of a PCB.

In a second embodiment, shown in FIGS. 9 and 10, the method includes an electrical test pattern 250 formed on a first layer of a multiple layer PCB. The test pattern 250 includes a plurality of radiating electrical traces 252 that encircle a through-hole site 254 and are in electrical connection with one another about the through-hole site 254. In this embodiment, the electrical traces 252 are electrically connected by trace segments 253, however, many other radiating trace layouts providing a suitably connected pattern are also possible and would be known to one of skill in the art. A non-plated through-hole, NPTH 256, is provided from a second layer of the PCB at a location corresponding to the through-hole site 254. When the first and second layers of the PCB are generally aligned, or in proper registration as shown in FIG. 9, NPTH 256 does not contact any of the traces 252, 253 of the test pattern 250. Therefore, electrical connection between the traces 252 remains intact. A subsequent electrical test of the traces 252 would show electrical continuity, thereby indicating that the first and second layers of the PCB were in acceptable registration with respect to each other in an area surrounding the test pattern 250.

If, however, the PCB layers were not in registration with respect to each other, as shown in FIG. 10, NPTH 256 would be shifted with respect to the through-hole site 254. An X-axis shift 260 and/or a Y-axis shift 262 may occur between NPTH 256 and the through-hole site 254. As a result, NPTH 256 overlays one or more of the electrical traces 252 with a corresponding cutting or removal of the trace segments 253 or portions of the electrical traces 252, as shown in area 264. Thus, electrical connection between some of the traces 252 is destroyed. A subsequent electrical test of the traces 252 would show no electrical continuity in the area corresponding to the X and Y axes shifts, 260, 262, thereby indicating that the first and second layers of the PCB were not in acceptable registration with respect to each other in an area surrounding the test pattern 250. The relative direction of the layer misregistration may generally be determined based on a determination of which traces 252 were affected by the test.

Figure 12:
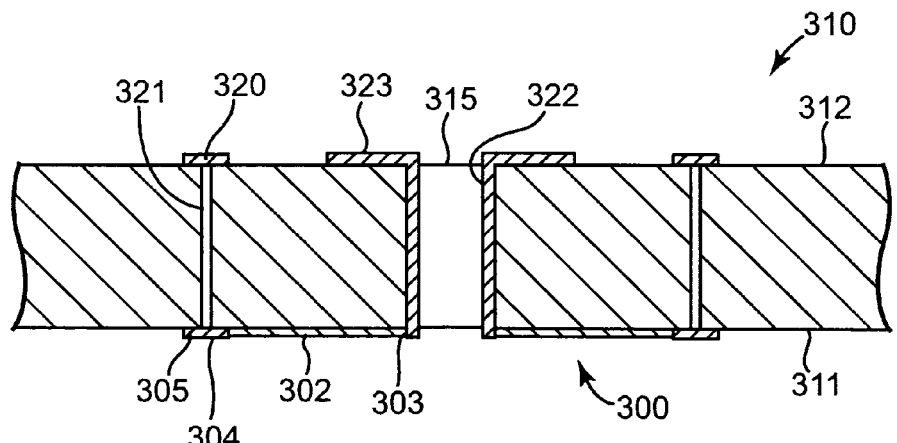
FIG. 12 is a cross-sectional view of the PCB and test pattern of FIG. 11.
Figure 13:
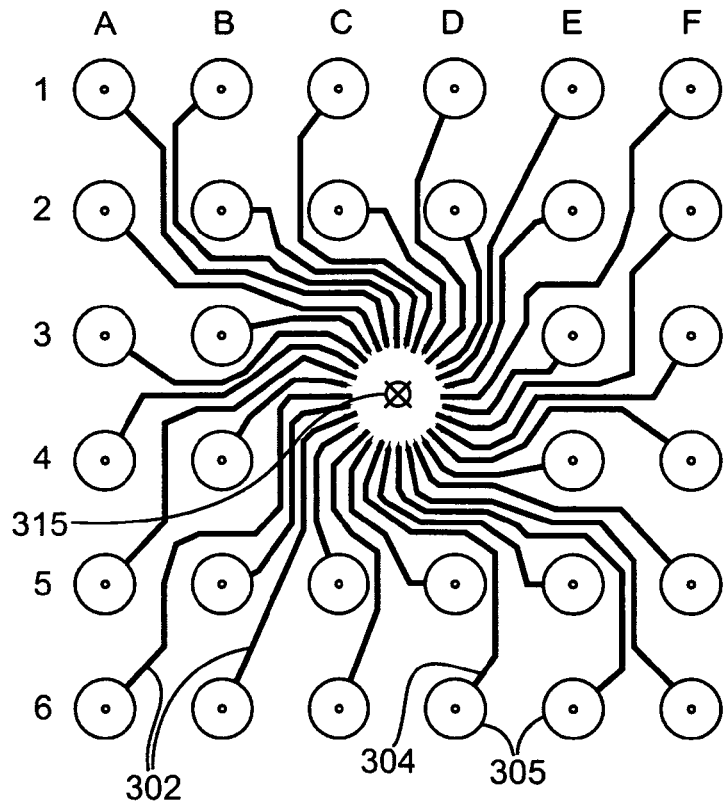
FIG. 13 is a full planar view of the test pattern embodiment of FIG. 11 showing multiple radiating traces and corresponding test probe pads.

In FIGS. 11-14, a third embodiment of the method is shown to include a test pattern 300 formed on multiple layers 311, 312 of a PCB 310. Features of the test pattern 300 include a plurality of electrical traces 302 formed on a first layer 311. The traces 302 have first ends 303 positioned to encircle a through-hole site 315 and second ends 304 formed as test pads 305 positioned away from the through-hole site 315 in an orderly array, as shown in FIG. 13. The first ends 303 of the traces 302, as shown in detail in FIG. 11, surround the through-hole site 315 to provide 360 degrees of resolution and detect approximately about 0.5 mil or less shifts in registration between the layers 311, 312. In one embodiment, the traces 302 are about 0.003 inches wide. Expanded trace ends 309, shown in an arrow head shape, are provided at the first ends 303 of the traces 302 to provide added electrical material for improved connectivity. It is to be understood, however, that other shapes of added electrical material may also be provided and are within the scope of the present invention. In one embodiment, the trace ends 309 are about 0.006 inches wide at their widest dimension. In this embodiment, thirty-two traces 302 are provided and include half of the trace ends 309 in a first, inner ring 306 and another half of the trace ends 309 in a second, middle ring 307 of circuitry. An optional third, outer ring 308 may also be provided to include additional trace ends 309 for added trace material.

On a second layer 312 of the PCB 310, a corresponding set of probe pads 320 are provided to overlie the test pads 305 of the first layer 311. Blind vias 321 are formed between the probe pads 320 and the test pads 305, as shown in detail in FIG. 12. A plated through-hole, PTH 322, is also formed from the second layer 312 to the first layer 311 within the through-hole site 315. A PTH pad 323 may also be provided for ease of probe connection during testing. The PTH 322 and pads 320, 323 provide an electrical test reference on the second layer 312 with respect to the test pattern features on the first layer 311. Any misregistration between the first and second layers 311, 312, will cause the PTH 322 to intersect and contact one or more traces 302 on the first layer 311, as shown in detail in FIG. 11. Depending on the degree of misregistration, the PTH 322 will contact trace ends 309 in the first, second and/or optional third rings 306, 307, 308.

Once the test pattern 300 has been completed, including drilling and plating of the PTH 322 and vias 321, electrical continuity testing between the PTH 322 and electrical traces 302 may be performed using the electrically conductive connecting pathways provided by the vias 321 and PTH 322. In order to facilitate the continuity testing, the test pads 305 and corresponding probe pads 320 may be provided in an established pattern that may or may not correspond to a testing device. In this embodiment, the test pads 305 are laid out in a matrix having six aligned rows and six aligned columns, best shown in FIG. 13. Table 1 shows the electrical mapping of the test pads 305 and their relationship with the first, second and third rings 306, 307 and 308 shown in FIG. 11.

A testing device or probe fixture may be used to test each individual test pad 305 with respect to the PTH 322 to provide conductivity information. The known trace pattern coupled with the conductivity data may then be used to calculate both the degree and direction of layer misregistration between the first and second layers 311, 312. Embodiments of testing devices and calculation techniques are described in more detail below.

TABLE 1

Figure 14:
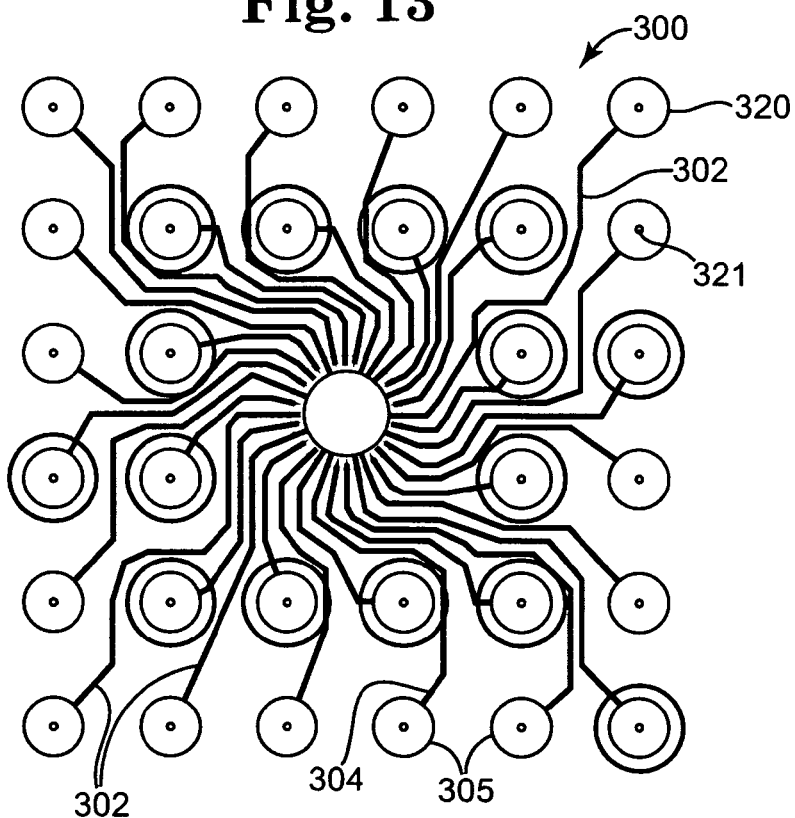
FIG. 14 is a planar view of the multiple layers of the test patterns of FIGS. 11-13 showing the traces, probe pads and plated through-hole.

Electrical Map for FIGS. 13 & 14

| No. | Col/Row | Ring |
|---|---|---|
| 1 | B1 | 1, 3 |
| 2 | B2 | 2 |
| 3 | C1 | 1, 3 |
| 4 | C2 | 2 |
| 5 | D1 | 1, 3 |
| 6 | D2 | 2 |
| 7 | E1 | 1, 3 |
| 8 | E2 | 2 |
| 9 | F1 | 1, 3 |
| 10 | E3 | 2 |
| 11 | F2 | 1, 3 |
| 12 | F3 | 2 |
| 13 | F4 | 1, 3 |
| 14 | E4 | 2 |
| 15 | F5 | 1, 3 |
| 16 | F6 | 2 |
| 17 | E6 | 1, 3 |
| 18 | E5 | 2 |
| 19 | D6 | 1, 3 |
| 20 | D5 | 2 |
| 21 | C6 | 1, 3 |

TABLE 1-continued

Electrical Map for FIGS. 13 & 14

| No. | Col/Row | Ring |
|---|---|---|
| 22 | C5 | 2 |
| 23 | B6 | 1, 3 |
| 24 | B5 | 2 |
| 25 | A6 | 1, 3 |
| 26 | B4 | 2 |
| 27 | A5 | 1, 3 |
| 28 | A4 | 2 |
| 29 | A3 | 1, 3 |
| 30 | B3 | 2 |
| 31 | A2 | 1, 3 |
| 32 | A1 | 2 |

Instead of test pads 305 and probe pads 320 being laid out in a grid or matrix pattern, the test and probe pads 305, 320 may alternatively be provided in a linear array, circular pattern or any other desired pattern located at a convenient area on the PCB 310. Optionally, the electrical traces 302 could be extended from a test area to an edge of the PCB 310 with the test pads 305 and probe pads 320 provided in a linear array. Electrical connection to the probe pads 320 could then be accomplished using an edge connector or other suitable electrical component.

As shown in detail in FIGS. 12 & 14, the second layer 312 includes the probe pads 320, PTH 322 and the PTH pad 323. As shown in detail in FIGS. 11, 12 & 14, the first layer 311 includes the traces 302 and trace pads 305, as well as PTH 322. In one embodiment, the second layer is an external or exposed layer on the PCB 310, such as a top or bottom layer. The first layer is an internal or intermediate layer, such as layers two or three in a four layer PCB, or layers two through "n–1" in an "n" layer PCB. These internal layers are not visually accessible for review or inspection, nor are they directly accessible for electrical connection by a probe, connector or other testing component. However, using the test patterns of the present invention, the indirect connection through the PTH 322 and the vias 321 make it possible to test for electrical conductivity or continuity of the electrical traces 302 to determine if misregistration between the tested layers exists and, if so, how much and in what direction.

The embodiment described and shown in FIGS. 11-14 is designed so that misregistration between the tested layers results in conductivity in one or more of the electrical traces. In a manner similar to the embodiment shown in FIGS. 9 & 10, however, this embodiment could also be designed so that misregistration resulted in the elimination of conductivity in previously conductive traces. Either method will work and is within the knowledge and ability of one of skill in the art, as well as within the discretion of the board and/or circuit designer.

As stated above, test patterns, such as test pattern 300, may be provided in an available area on the PCB. In one embodiment, at least three test patterns are formed, each in a different area or corner on the PCB, so as to provide suitable quantitative data for determining the extent and direction of any misregistration over the PCB. Multiple test patterns are recommended because isolated misregistration between certain layers of the multiple layer PCB may occur for numerous reasons, including warping, wrinkling, etc. Full sheet misregistration is most effectively determined through multiple data points. Circuit board manufacture commonly involves the creation of multiple circuit boards on a large sheet, with subsequent processing steps to divide the sheet into the smaller final-size boards. Use of at least three test patterns on these larger sheets provides helpful information for the board manufacturer as to the misregistration of the layers, allowing for changes to the manufacturing processes to reduce or eliminate the misregistration and thus reduce scrap and improve quality. Providing such test patterns on the larger sheets is easily accommodated in the marginal areas of the sheets, thus readily providing helpful information without interfering with the desired board design(s) and/or layout.

Figure 15:
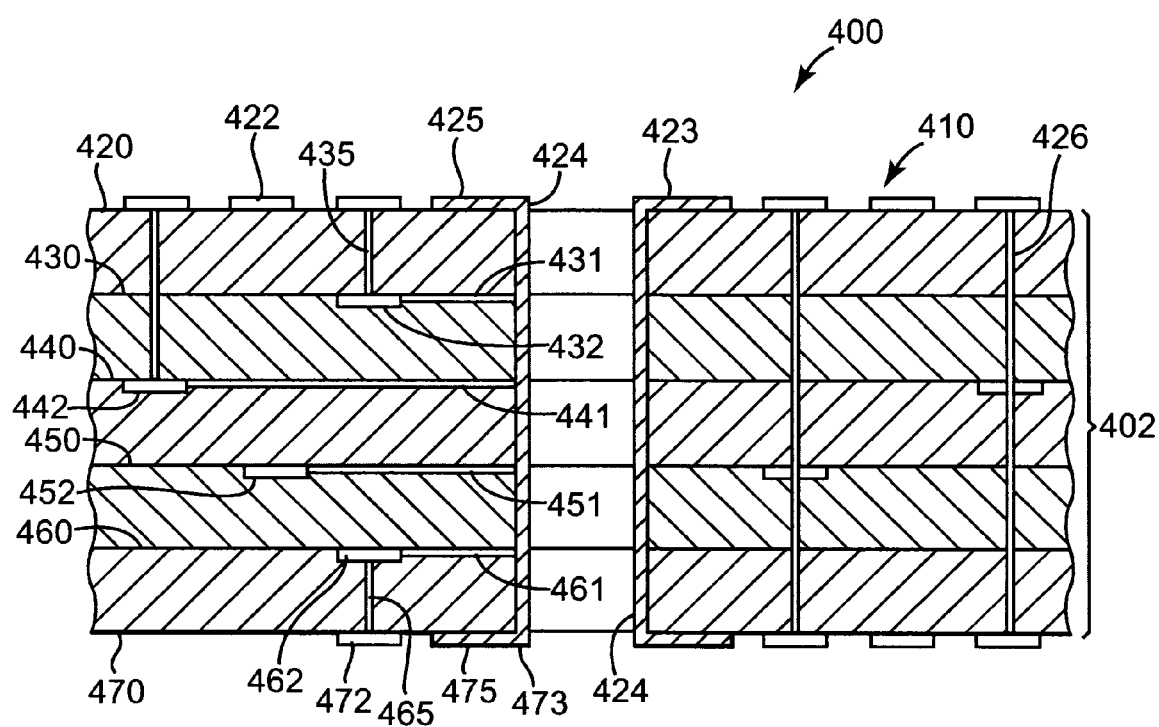
FIG. 15 is a cross-sectional view of a multiple layer PCB including a fourth embodiment of a test pattern in accordance with the present invention.
Figure 16:
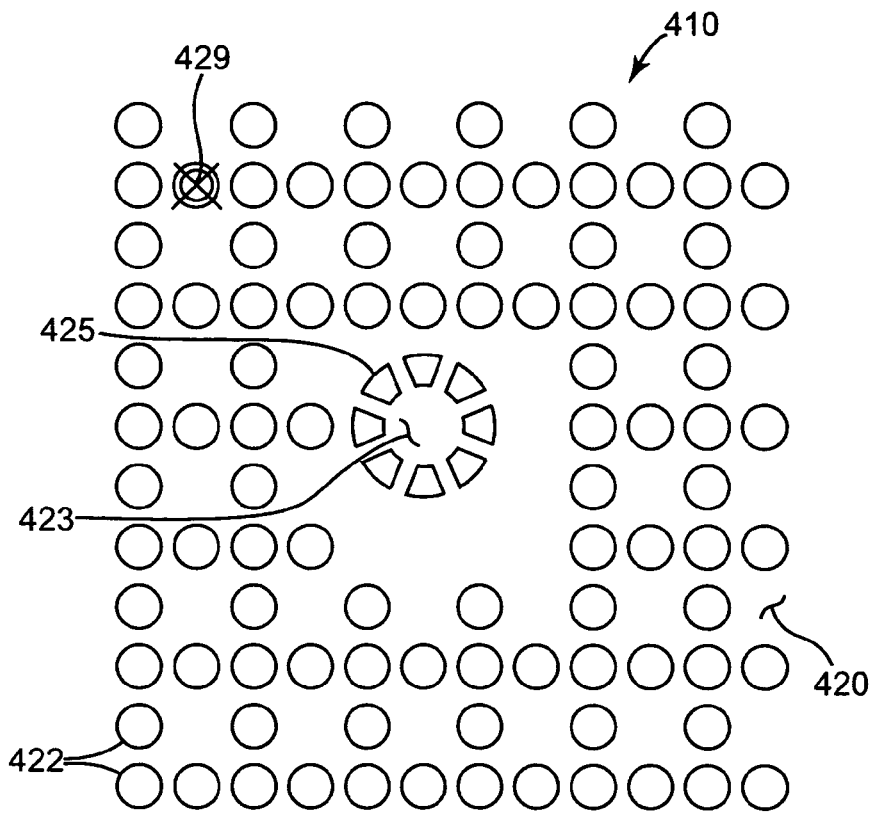
FIG. 16 is a planar view of the top layer probe pads for the test pattern of FIG. 15.
Figure 17:
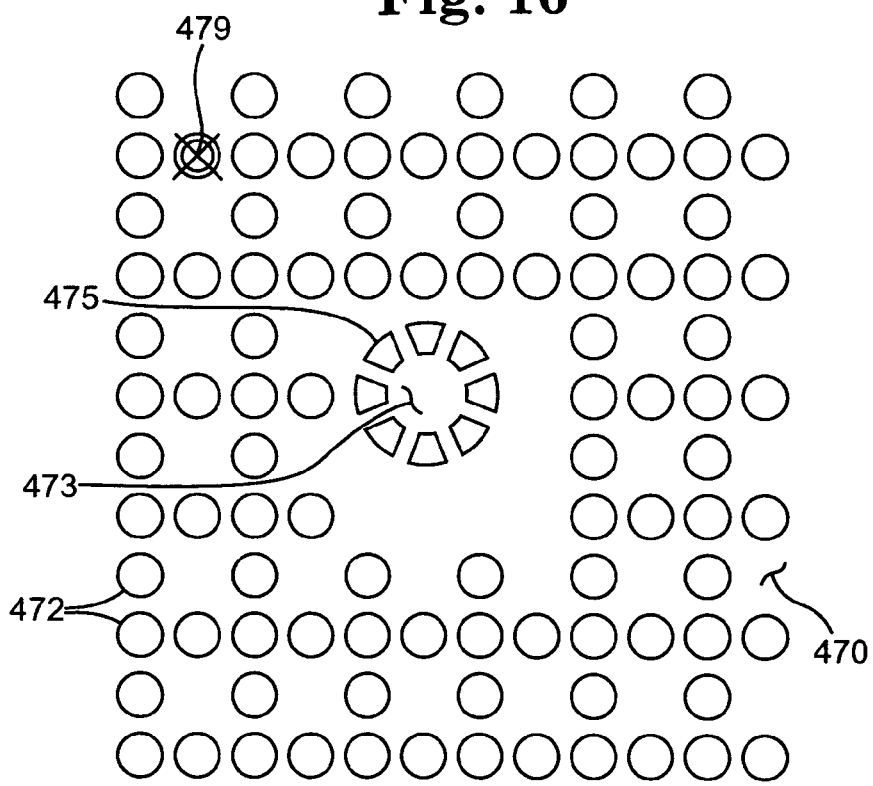
FIG. 17 is a planar view of the bottom layer probe pads for the test pattern of FIG. 15.
Figure 18:
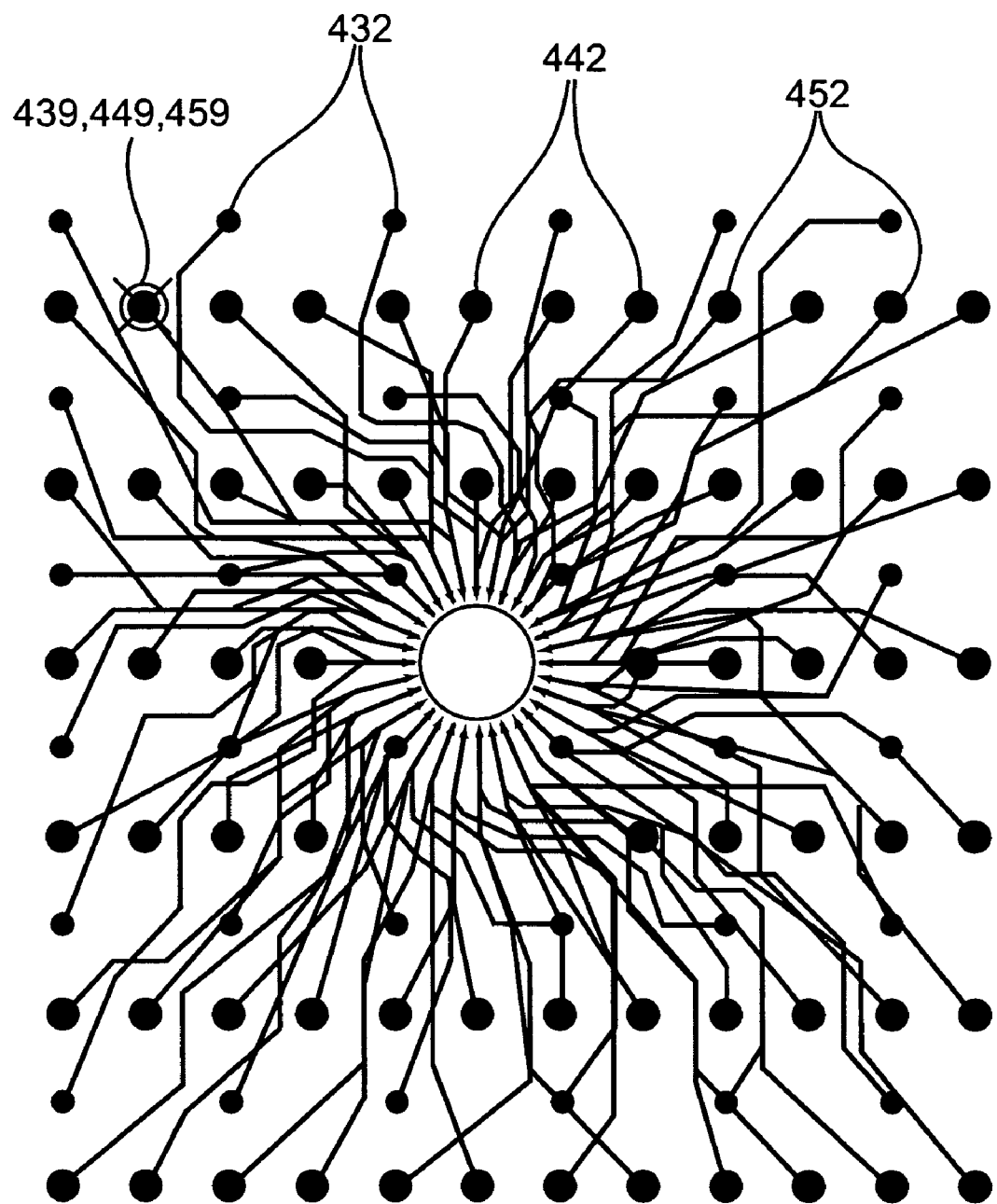
FIG. 18 is a planar view of the multiple inner layers of the test pattern of FIG. 15 showing the electrical traces and trace pads.

In FIGS. 15-20, a fourth embodiment of the method is shown in accordance with the present invention for a PCB 400 having six layers 402. The PCB 400 includes a test pattern 410 formed among the layers 402. A top layer 420, or layer one, as shown in detail in FIG. 16, includes a pattern of probe pads 422 laid out about a through-hole site 423 and a PTH pad 425 surrounding a PTH 424 formed within the through-hole site 423. As seen in FIG. 15, the PTH 424 extends through all six layers 402. A bottom layer 470, or layer six, as shown in detail in FIG. 17, also includes a pattern of probe pads 472 laid out about a through-hole site 473 through which the PTH 424 extends. A PTH pad 475 surrounds the PTH 424. Layers one 420 and six 470 are external, exposed or outer layers of the multiple layer PCB 400.

Figure 19:
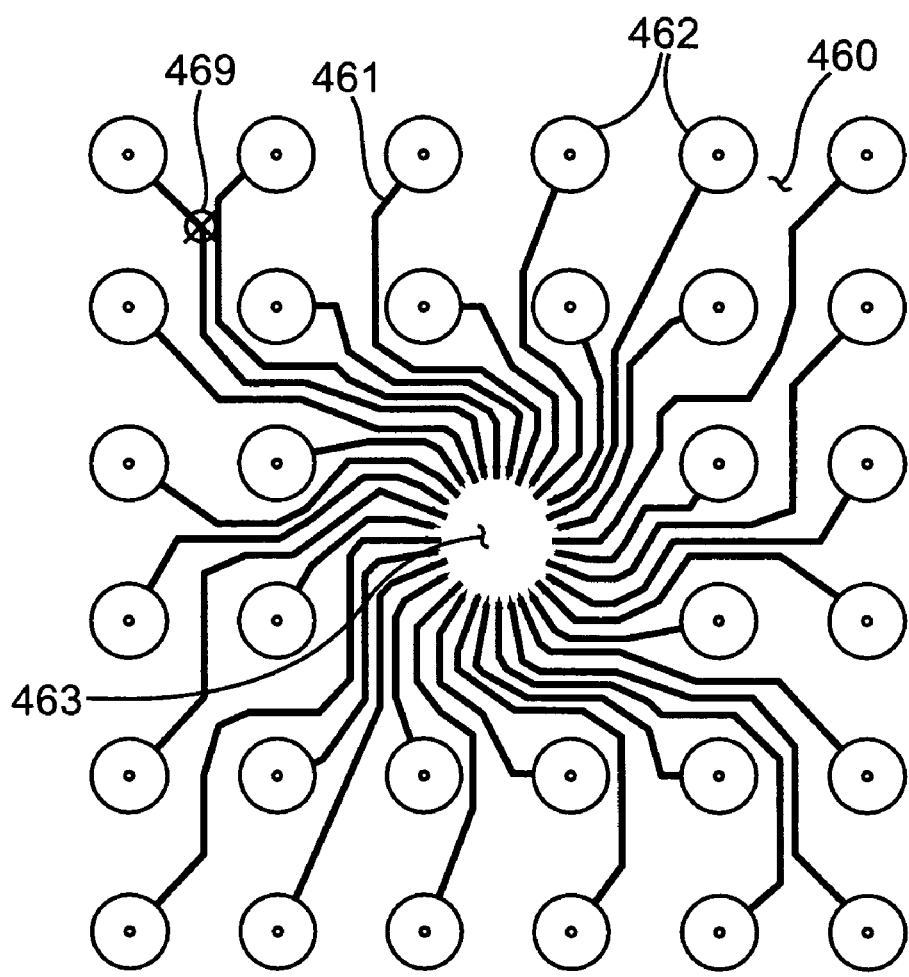
FIG. 19 is a planar view of the fifth, inner layer of the test pattern of FIG. 15.

A plurality of intermediate, inner or internal layers 430, 440, 450 and 460, or layers two through five, respectively, each include a pattern of electrical traces 431, 441, 451, 461 having first ends positioned to surround through-hole sites 433, 443, 453, 463 and second ends including trace pads 432, 442, 452, 462, respectively. As seen best in FIG. 18 for layers two through four, the traces 431, 441, 451 are routed from the through-hole sites 433, 443, 453 outward to the plurality of trace pads 432, 442, 452 located in a orderly overall matrix corresponding to the matrix of probe pads 422, 472 on the top and bottom layers 420, 470, respectively. Although overlap of the traces 431, 441, 451 is shown in the multiple layer planar view, especially about the through-hole sites 433, 443, 453, the traces 431, 441, 451 are electrically isolated from each other from layer to layer, as shown in FIG. 15. The trace pads 432, 442, 452, on the other hand, are provided in a separate, non-overlapping design throughout the matrix. As shown in FIG. 19, but not in FIG. 18, the components of layer five 460 are laid out in a manner similar to those of layer two 430. Reference points 429, 439, 449, 459, 469 and 479, are provided on each layer 420, 430, 440, 450, 460 and 470, respectively, for alignment of the test pattern features with respect to the other layers.

Figure 20:
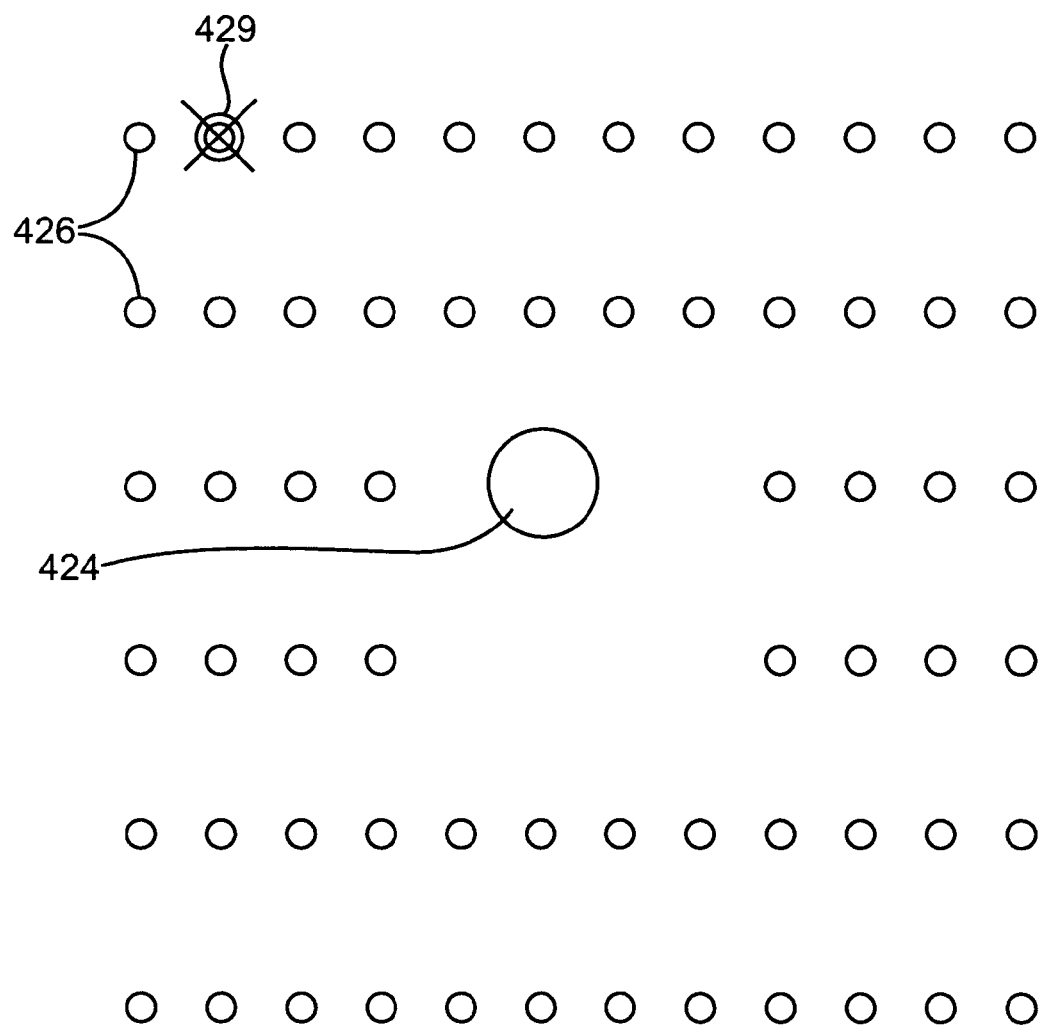
FIG. 20 is a planar view of the plated through-holes provided with the test pattern of FIG. 15.

Connecting pathways between the layers 402 are provided in numerous ways. As with the embodiments shown and described above, the PTH 424 extends through all of the layers 402. As shown in FIG. 20, a plurality of plated probe pad through-holes 426 are also provided, which extend between all of the layers 402. These probe pad holes 426 correspond in location with the probe pads 442, 452 for layers three and four 440, 450, respectively. In addition, plated blind vias 435 are provided between layer one 420 and layer two 430, and plated blind vias 465 are provided between layer six 470 and layer five 460. The trace pads 432, 462 of layers two 430 and five 460, respectively, are staggered from the trace pads 442, 452 of layers three 440 and four 450, respectively.

Provision of the test pattern 410 on a multiple layer PCB, such as PCB 400, allows for an analysis of possible misregistration between the many layers 402. The test pattern 410 is laid out, layer by layer, during design and manufacture of the PCB 400. Upon completion of the PCB 400, the plated holes 424 and 426 are formed by drilling and plating (or other suitable processes), along with the blind vias 435 and 465. Once these holes and vias are available, the PCB 400 is tested using the method described above. Electrical probes contact the probe pads 422, 472 and PTH pads 425, 475 on the top 420 and bottom 470 layers, respectively. Conductivity or continuity is then checked between the individual trace pads 432, 442, 452, 462 with respect to the probe pads 422, 472. In this embodiment, the presence of continuity indicates misregistration because the PTH 424 would be misaligned with respect to the through-hole sites 423, 433, 443, 453, 463 and 473, resulting in contact between the PTH 424 and one or more electrical traces 431, 441, 451, 461 on one or more of the individual layers 430, 440, 450, 460. Using the known pad layout of each of the layers 402, coupled with the continuity data, allows for a determination of the presence and direction of the misregistration between one or more layers 402.

Alternatively, as described above, the test pattern 410 may be provided such that misregistration results in a break of conductivity at the traces by the formation of a non-plated hole at the through-hole sites. Suitable trace patterns would be provided to accommodate this type of a testing set up.

The method, as described above, provides for testing misregistration between layers in a multiple layer printed circuit board. Such a PCB may include many layers, and is not limited by the examples set forth above. One or more test patterns, such as, in one embodiment, at least three test patterns, are formed on the PCB or on a larger sheet containing a plurality of PCB's during manufacturing. The test data from the plurality of test patterns provides input for determining the presence and direction of misregistration between the provided layers of the multiple layer PCB. This knowledge may then be used to correct manufacturing processes, improve overall quality of the manufactured boards, reduce scrap and waste in the manufacturing process and improve overall quality of the boards.

Once a method for accessing location data from inner layers of a multiple layer PCB is provided, the data may be obtained, recorded and then manipulated to provide quantitative information as to the misregistration of one or more layers of the PCB. The present invention also provides a test apparatus that quickly and easily utilizes such a method to obtain the necessary data. In addition, the present invention provides a mathematical model and calculation method for efficiently manipulating the data, so as to calculate and quantify the amount and direction of any misregistration between the layers.

Figure 21:
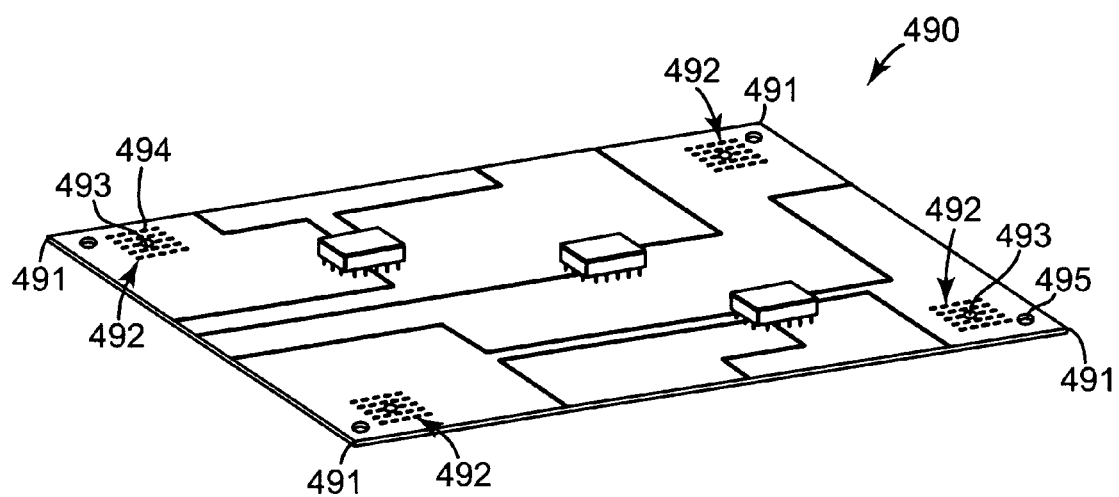
FIG. 21 is a perspective view of a PCB in accordance with the present invention, including four test patterns.

In FIG. 21, a fifth embodiment of a multiple layer PCB 490 is shown, including four test patterns 492 each having a PTH 493 and probe pads 494. The PCB 490 includes four layers and four corners, with each test pattern 492 formed near a corner 491 and throughout the four layers. Each corner 491 also includes an alignment hole 495 formed through the four layers of the PCB 490. This PCB 490 will be used as the example for the following discussion concerning a test apparatus and calculation method of the present invention.

Figure 22:
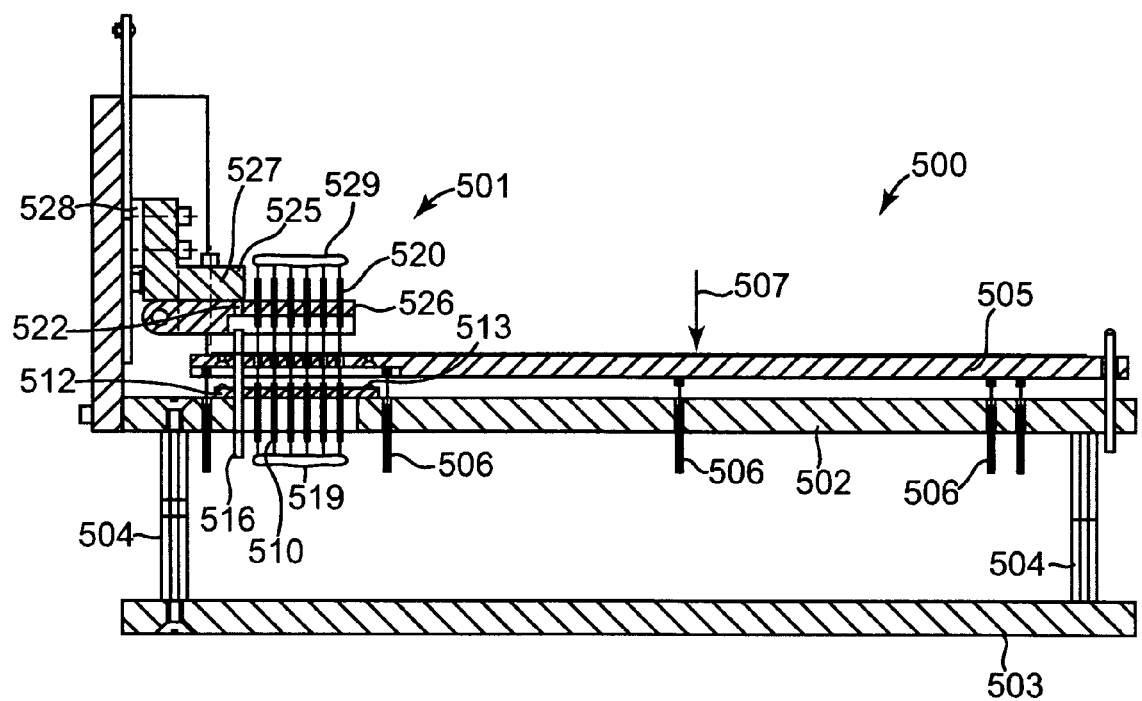
FIG. 22 is a side sectional representation of one embodiment of a test apparatus in accordance with the present invention.
Figure 23:
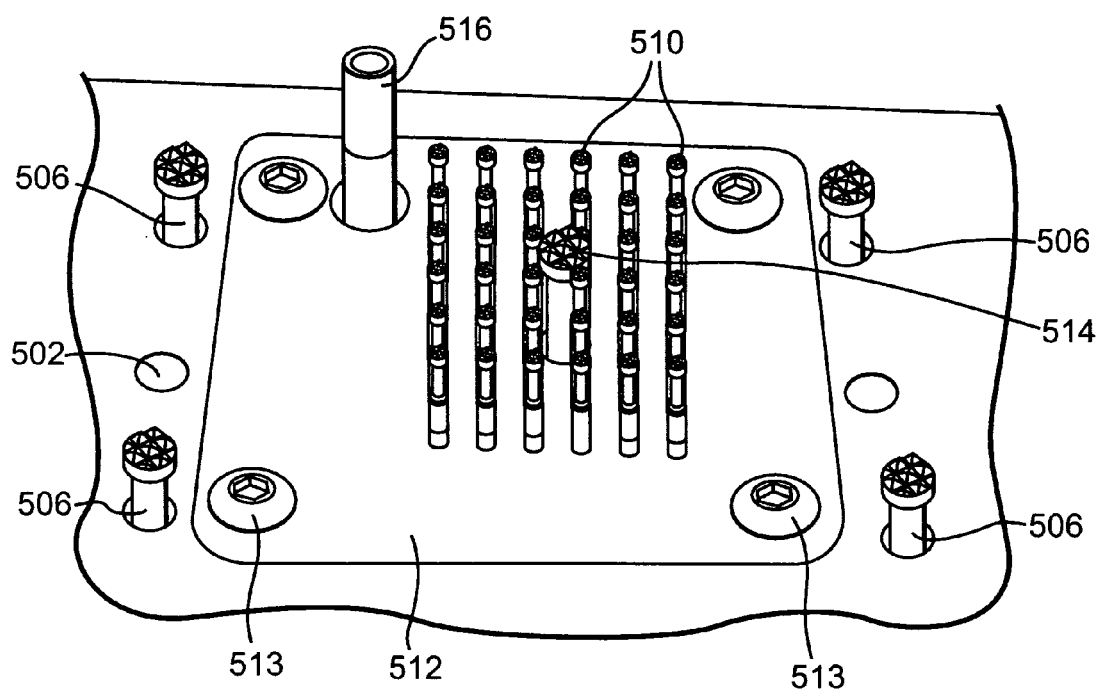
FIG. 23 is a perspective view of components of the test apparatus of FIG. 22.

In FIGS. 22 and 23, one embodiment of a test apparatus 500 in accordance with the present invention is shown, having a test mechanism 501 and a base 502, supported on a stand 503 including standoffs 504. A platform 505 is moveably mounted to the base 502 by a plurality of springs 506, such that a force 507 will compress the springs 506 and move the platform 505 toward the base 502. Release of the force 507 allows the platform 505 to return to its former position with respect to the base 502.

The test mechanism 501 includes a plurality of lower conductive pins 510 provided in the base 502 protruding upward toward the platform 505. As shown, the lower pins 510 are coupled to a lower pin plate 512 mounted to the base 502 at fasteners 513. The pins 510 are positioned so as to correspond to an outer layer set of probe pads on the test patterns of the PCB's to be tested by the apparatus 500. A larger central lower conductive pin 514 is also provided to correspond in position with a PTH and PTH pad of the test pattern. An alignment post 516 may be provided for positioning of the PCB with respect to the pins 510. In one embodiment, the alignment post 516 is inserted through the alignment hole 495 to aid in positioning the PCB 490 with respect to the pins 510. Alternatively, other methods and structures for aligning the PCB with respect to the pins 510 and/or test apparatus 500 may be used, as is known by one of skill in the art.

The test mechanism 501 also includes a plurality of upper conductive pins 520 that are suspended above the platform 505 on a slide mechanism 525. The upper pins 520 are positioned to correspond to another outer layer set of probe pads on the test patterns (such probe pads 494 of test patterns 492, shown in FIG. 21), and include a central upper conductive pin (not shown) corresponding to the PTH (such as PTH 493), in the same manner as the lower pins 510, 514. The upper pins 520 and lower pins 510 may or may not individually align with each other, depending on the design of the test patterns provided on the PCB's being tested.

The slide mechanism 525 includes a pin block 526 coupled to a slide block 527 mounted on a slide 528 providing for upper pin movement toward and away from the platform 515. An alignment recess 522 is positioned to correspond to alignment pin 516, such that movement of the slide mechanism 525 toward the platform 515 results in insertion of the alignment pin 516 into the alignment recess 522 so as to align the set of upper pins 520 and the set of lower pins 510 with respect to each other.

The upper conductive pins 520 and lower conductive pins 521, including both the upper and lower central pins 514, may be spring loaded. One type of conductive spring pin is a pogo pin, commonly used in electronic test equipment. Alternatively, other types of conductive pins or probes may also be used, as is known to one of skill in the art.

Figure 24:
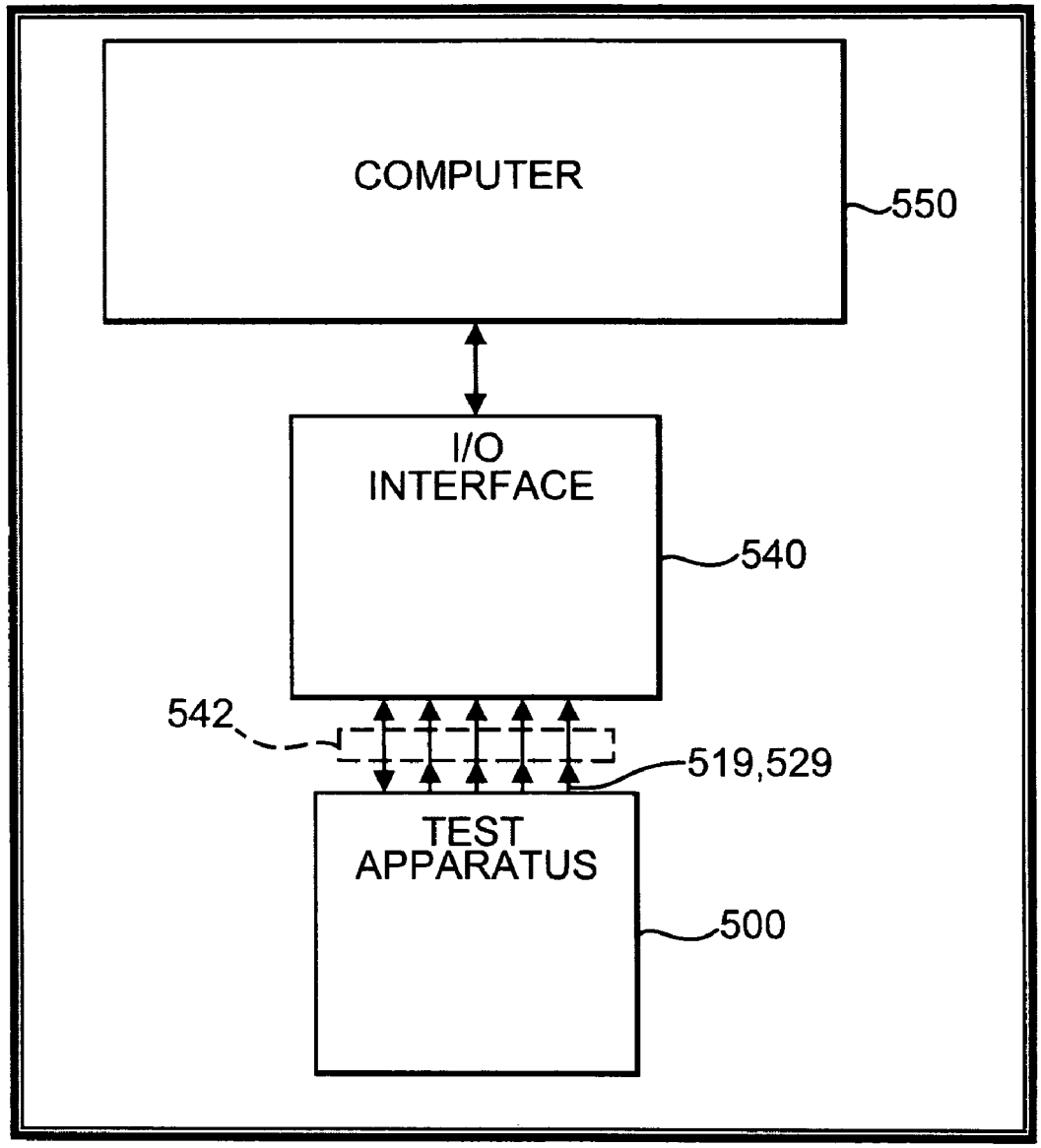
FIG. 24 is a block diagram of a system in accordance with the present invention, including the test apparatus coupled to a computer.

The upper pins 520 and lower pins 510 are electrically connected at their distal regions 529, 519, respectively, to an electrical input device. In FIG. 24, the test apparatus 500 is shown electrically coupled via the pin connections 519, 529 to an I/O interface 540, or other suitable input/output device, which is, in turn, electronically coupled to a computer 550, including a CPU, microprocessor or other suitable data manipulation and calculation device (hereinafter referred to generally as a computer). The computer 550 may or may not have a display associated with it, but is capable of at least indicating in some manner whether the tested PCB passes or fails the desired testing using the test apparatus and the provided test patterns. Optional electronic devices or components may also be included between the electrical output of the pins at pin connections 519, 529 and the I/O interface 540, or between the I/O interface 540 and the computer 550. In FIG. 24, a bank of resisters 542 is inserted between the pin connections 519, 529 and the I/O interface 540 to clean up the electrical signal from the pins 510, 520.

In operation, a PCB to be tested is placed on the platform 505 with a test pattern suitably positioned over the lower pins 510, such that the bottom layer probe pads are aligned over the lower pins 510. In the provided example, the PCB 490 includes an alignment hole 495 to be placed over the alignment pin 516 to aid in properly locating the PCB 490 on the test apparatus 500. Once correctly positioned, the slide mechanism 525 is lowered until the upper pins 520 contact the top layer probe pads 494 of the test pattern 492 on the PCB 490. The slide mechanism 525 is further lowered causing the platform 505 to move toward the base 502 until the lower pins 510 are in contact with the bottom layer probe pads (not shown) on the PCB 490 and are compressed. The slide mechanism 525 is then held in this test position while the test on the PCB 490 is run. A spring catch (not shown) may be provided to hold the slide mechanism 525 in the test position to ensure adequate contact between the upper and lower pins 520, 510 and the test pattern probe pads during the test. Alternatively, other mechanisms suitable for keeping the pins in position may also be used, and are within the scope of the present invention.

One embodiment of a test to be performed on a test pattern in accordance with the present invention includes the input of a positive electrical signal at the upper layer PTH. The bottom layer PTH is then checked for a positive signal, to determine if the test pattern is properly loaded into the test apparatus 500. Each probe pin 510, 520 is then checked for a positive signal and the result is recorded by the computer 550 as one ('1') for a positive signal or zero ('0') for a negative signal in a matrix, or other data record. As described above, in one embodiment of the test patterns, a positive signal at the probe pad indicates continuity between the related intermediate layer test trace and the PTH due to some degree of misregistration between the tested layers of the PCB.

The test apparatus 500, as shown, is configured for the manual placement of the PCB on the apparatus 500 with a test pattern positioned in the test mechanism 501 relative to the test pins 510, 520. Once that test pattern has been tested, the PCB is manually repositioned so that another test pattern on the PCB is positioned in the test mechanism 501. In the provided example, the PCB 490 includes alignment holes 495 at each corner 491 and is rotated so as to place each alignment hole 495 over the alignment pin 516 and test each test patterns 492 sequentially. This is repeated until each provided test pattern 492 has been tested. Alternatively, the test apparatus 500 may include a plurality of testing mechanisms 501, the number and position of which correspond to the number and location of the test patterns provided on the PCB's to be tested. With multiple test mechanisms 501, each test pattern may then be tested simultaneously, eliminating the need to reposition the PCB in the test apparatus 500. Alternatively, the test apparatus 500 may include a movement mechanism that automatically moves either the PCB or the test mechanism 501 so as to test each test pattern on the PCB. A movement mechanism of this type may be programmable so as to accommodate different types of PCB's and different numbers and/or locations of test patterns for the PCB's to be tested. Other options for providing sequential and/or simultaneous testing of the test patterns provided on the PCB to be tested are possible and within the scope of the present invention.

The formation of the test patterns during the manufacture of the PCB are themselves subject to manufacturing errors and tolerances. Therefore, there are potential discrepancies between the actual location and size of each PTH as compared to the theoretical or designed location and size of that PTH. In order to adjust for these differences, it is useful to determine the actual location of each PTH with respect to a reference on the top and bottom, or exposed, layers. In addition, measurement of the diameter of each drilled and plated PTH is also useful.

In one embodiment, the test apparatus 500 is used to test and record the location of each PTH with respect to a reference on the top and bottom external layers. Additionally, the diameter of the PTH is also measured and recorded.

Alternatively, in another embodiment, a visual measurement system, such as commercially available visual coordinate measurement system, is used to provide this information. Visual measurement systems are routinely used during the manufacture of PCB's and so are readily available to provide the necessary information. Visual reference points, also commonly known as fiducial or fiduciary points, are routinely included on an external layer of a PCB as part of the artwork of that layer. These fiducial points are provided as a visual reference, or for measurement purposes, for use with an optical instrument. Use of these already provided reference points with an available visual/optical system allows for a convenient location and measurement system for the top and bottom layers of the PCB.

In this embodiment, the visual measurement system locates the center of the PTH for each test pattern on the PCB top layer. The actual location is then compared to the theoretical planned location of the PTH based on the artwork of the top layer. This actual location data is then referenced with respect to the first layer and recorded. Then, the diameter of each PTH is measured and also recorded. The bottom layer is also visually checked, in the same manner as the top layer, and the data is recorded. The data collected and recorded by the visual measurement system may be manually input into the computer 550, or may alternatively be transferred electronically by a suitable connection provided for this purpose, as is known in the art.

The above described visual test procedure for the top and bottom layers may be performed before or after the prior described test for the intermediate layer data. Alternatively, if the top and bottom layer test procedure is to be performed by the described test apparatus 500, the test procedure may be run before, after or as part of the intermediate layer testing.

Figure 25:
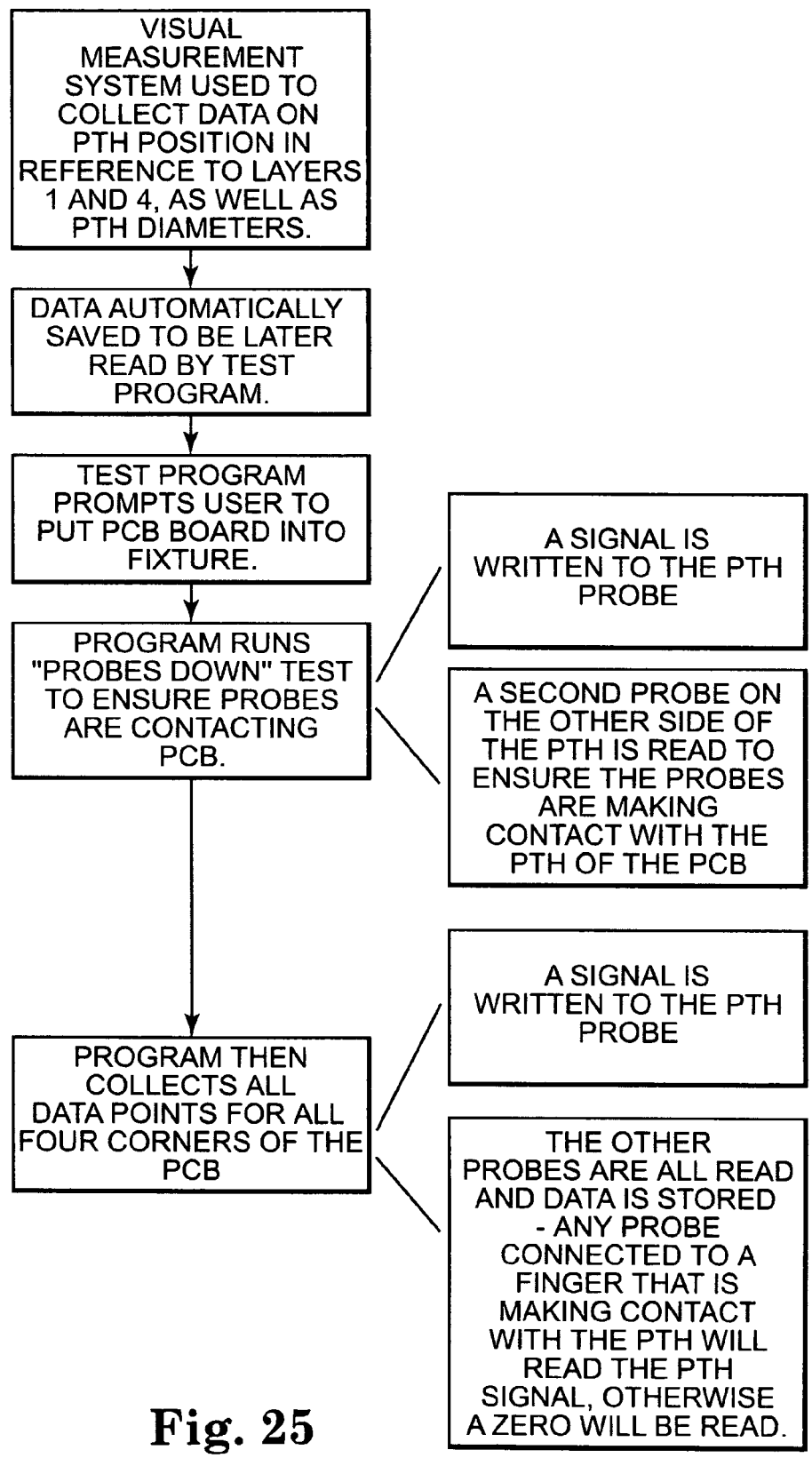
FIG. 25 is a block diagram flow chart of a software program in accordance with the present invention, including steps for measuring data to be input into the software program.
Figure 26:
FIG. 26 is a screen print of the software program including a data input screen.
Figure 27:
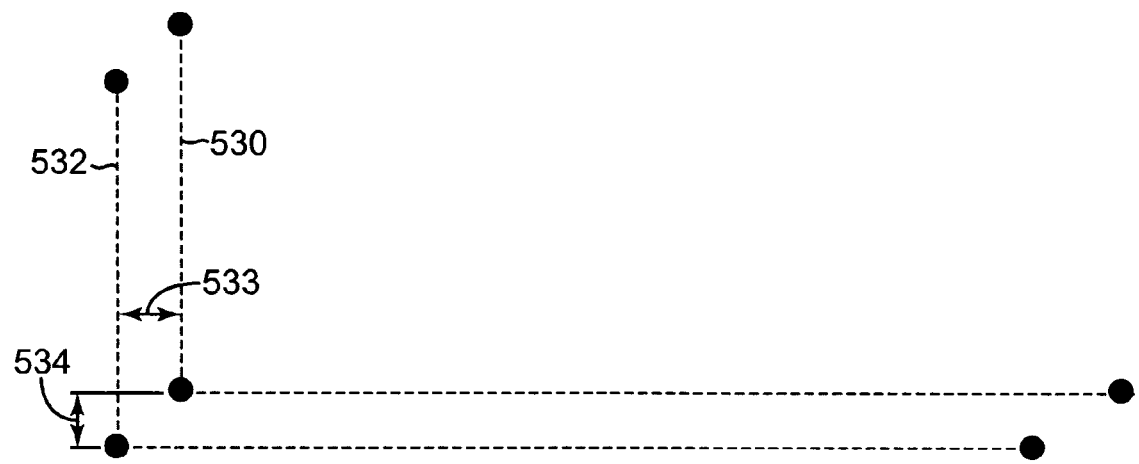
FIG. 27 is a schematic representation of one misregistration characteristic, offset, calculated by the present invention.
Figure 28:
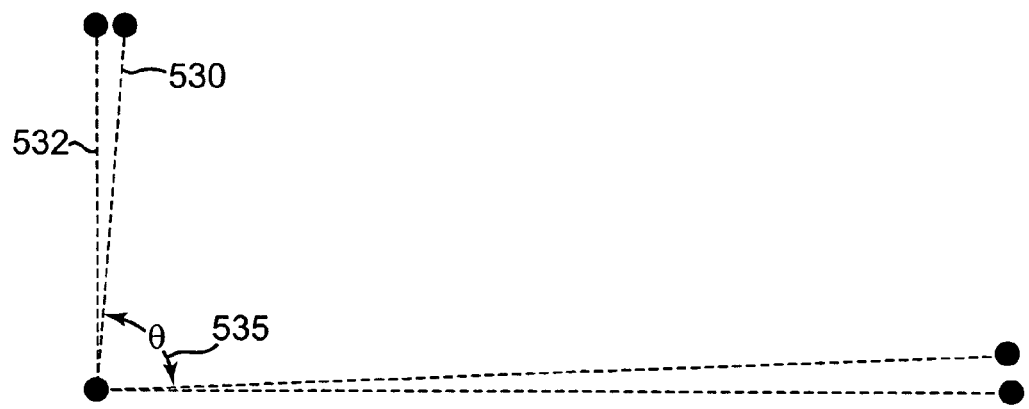
FIG. 28 is a schematic representation of one misregistration characteristic, normalcy, calculated by the present invention.
Figure 29:
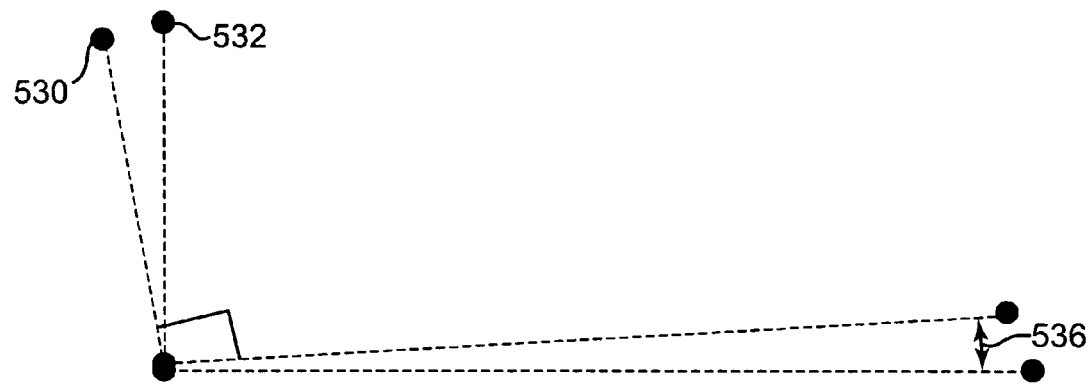
FIG. 29 is a schematic representation of one misregistration characteristic, skew, calculated by the present invention.
Figure 30:
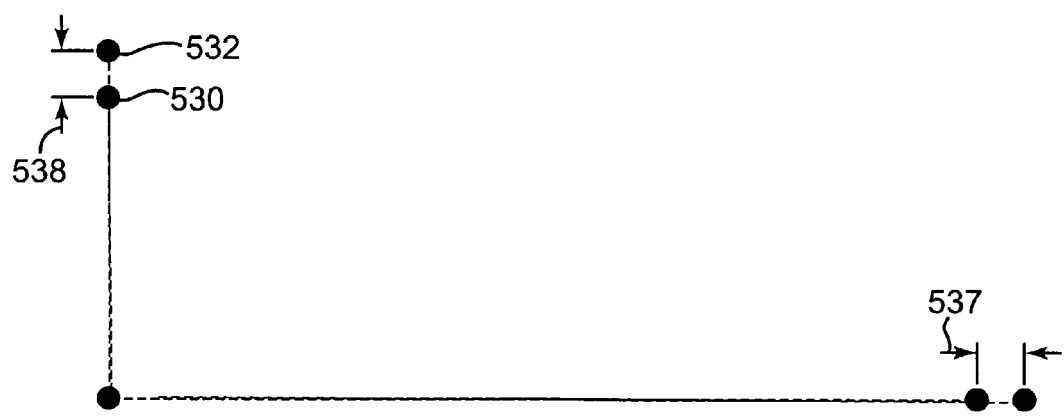
FIG. 30 is a schematic representation of one misregistration characteristic, growth, calculated by the present invention.

FIG. 25 shows a block diagram flow chart for the software of the present invention including the above described steps of data acquisition. The test performed by the test apparatus 500 provides continuity data between each PTH and the plurality of test traces formed in a ring about the PTH location on each intermediate layer of the PCB. In addition, the location and size of each PTH is determined for the top and bottom layers. FIG. 26 shows a screen print of the step in the software program wherein the above referenced visual test date is input into the compute and software program. This data is recorded for each test pattern and then may be used with a mathematical model and calculation method for efficiently manipulating the data, so as to calculate and quantify the amount and direction of any misregistration between the layers of the PCB. This misregistration information may include growth in both the X and Y directions, offset from a pre-determined reference, normalcy and skew. These variable characteristics of the PCB layers are defined as shown in FIGS. 27-30. FIG. 27 shows an offset 533 in an X direction and an offset 534 in an Y direction of a measured position 530 with respect to a designed or desired position 532. FIG. 28 shows a normalcy variation of angle 535 between the measured position 530 and the designed position 532. FIG. 29 shows a skew variation of angle 536 between the measured position 530 and the designed position 532. Finally, FIG. 30 shows a positive growth change 537 in the X direction and a negative growth change 538 in the Y direction between the measured position 530 and the designed position 532.

Figure 31:
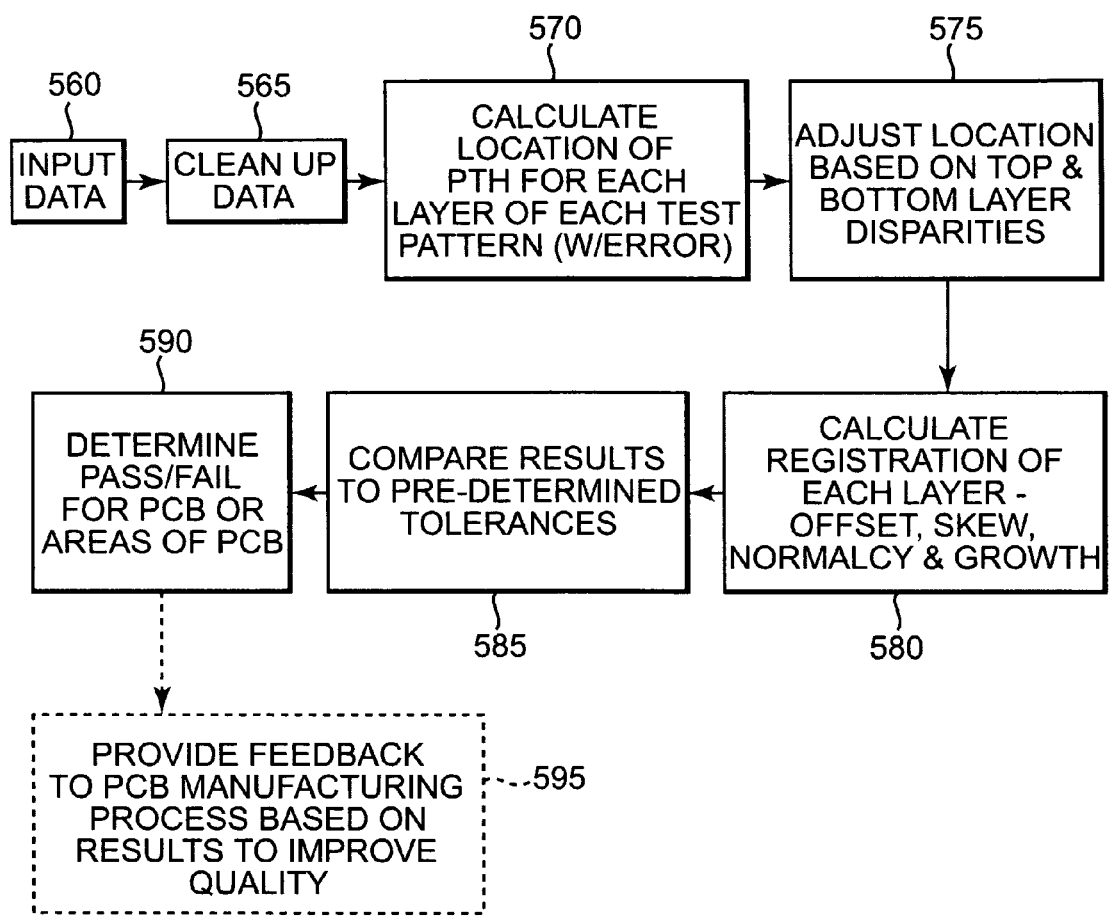
FIG. 31 is a flow chart of the method of the present invention for determining misregistration of the layers of a PCB based on data measured by a test pattern in accordance with the present invention.

The mathematical model and calculation method of the present invention is shown in general in flow chart form in FIG. 31. The preceding steps, including the formation of test patterns and continuity testing by a test apparatus in accordance with the present invention, are shown in the flow chart of FIG. 6. Once the continuity data has been obtained from the provided test patterns on the PCB, the data is input into a data manipulation device at Block 560, such as computer 550. The additional data concerning the locations and sizes of the top and bottom layer PTH's may be input into the computer 550 at Block 560.

Figure 32:
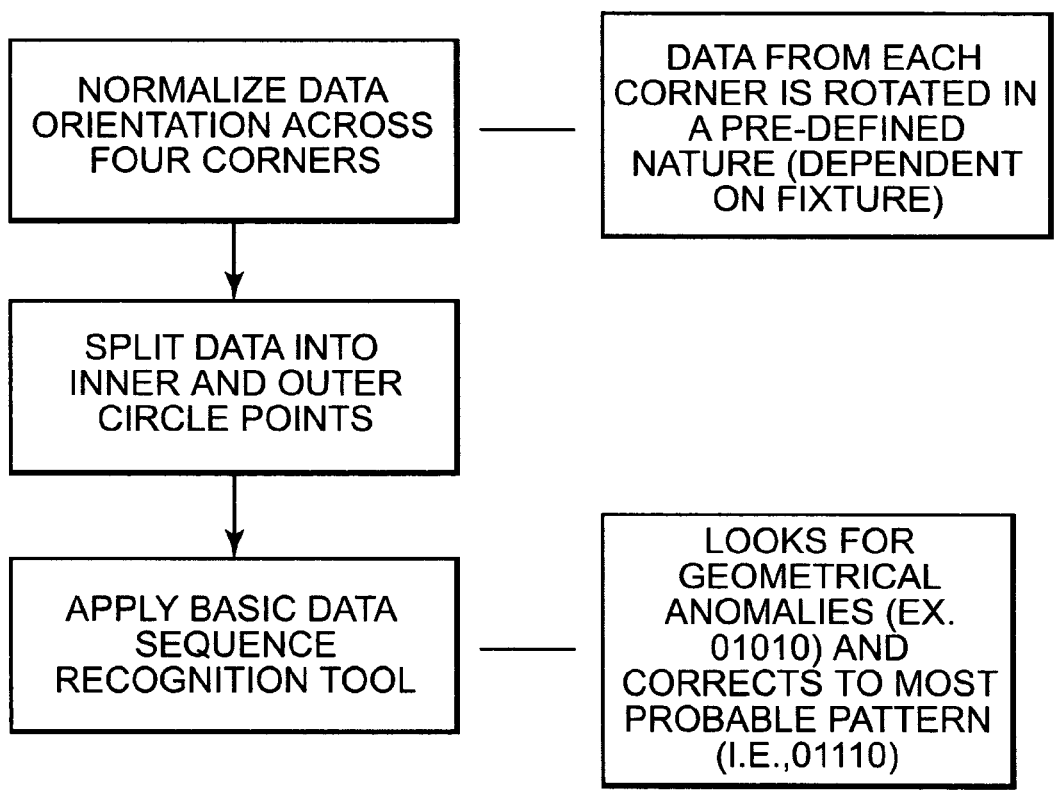
FIG. 32 is a block diagram flow chart of the software program of the present invention, including steps for cleaning the input data.
Figure 33:
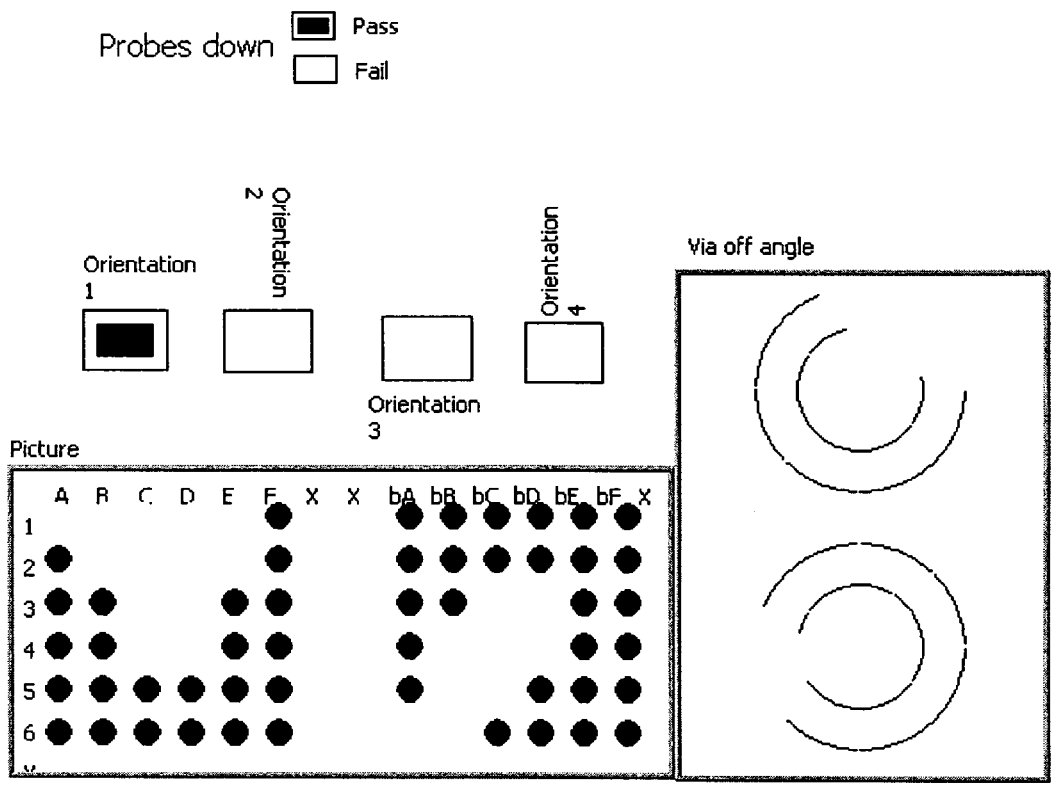
FIG. 33 is a screen print of the software program including a first cleaning step per FIG. 32.

In order to utilize the incoming data in an efficient manner, the data may need to be "cleaned up" or otherwise adjusted and/or modified, as shown in Block 565 of FIG. 31, so as to be in a predetermined form for use by the calculation method. FIG. 32 shows a block diagram flow chart of the software of the present invention including the steps for data clean-up and organization. This cleaning step at Block 565 may differ depending on the type of test patterns provided on the PCB and the test device used to obtain the data. For example, with the test described above for PCB 490 and test device 500, each corner test pattern 492 of the PCB 490 is tested sequentially by rotation of the PCB 490 and placement of the test pattern 492 into the test device 500. As the test patterns 492 are rotated, the data obtained from the test pattern 492 is also rotated with respect to the data from the other three test patterns 492. Therefore, in one embodiment, the data for three of the test patterns 492 is rotated to normalize the data and provide it in comparable form for use by the calculation method. FIG. 33 shows a screen print of this step in the software.

As described above with respect to FIGS. 11-14, the trace ends 309 of the intermediate layer traces 302 may be alternatingly staggered in two rings about the through-hole site 315. Half of the trace ends 309 are within a first ring 306 and the other half are within a second ring 307. The traces 302 and trace pads 305 corresponding to the trace ends 309 and their rings 306, 307 are mapped as shown in Table 1. The theoretical or designed diameter of each ring is a known value for each test pattern and pre-programmed into the computer 550 with respect to the calculation method. The input data is thereby divided into the first and second, or inner and outer, ring points based on the trace mapping, such as shown in Table 1. Other basic information about the test pattern design and dimensions may also be preprogrammed into the computer 550 and made available to the calculation method.

Figure 34:
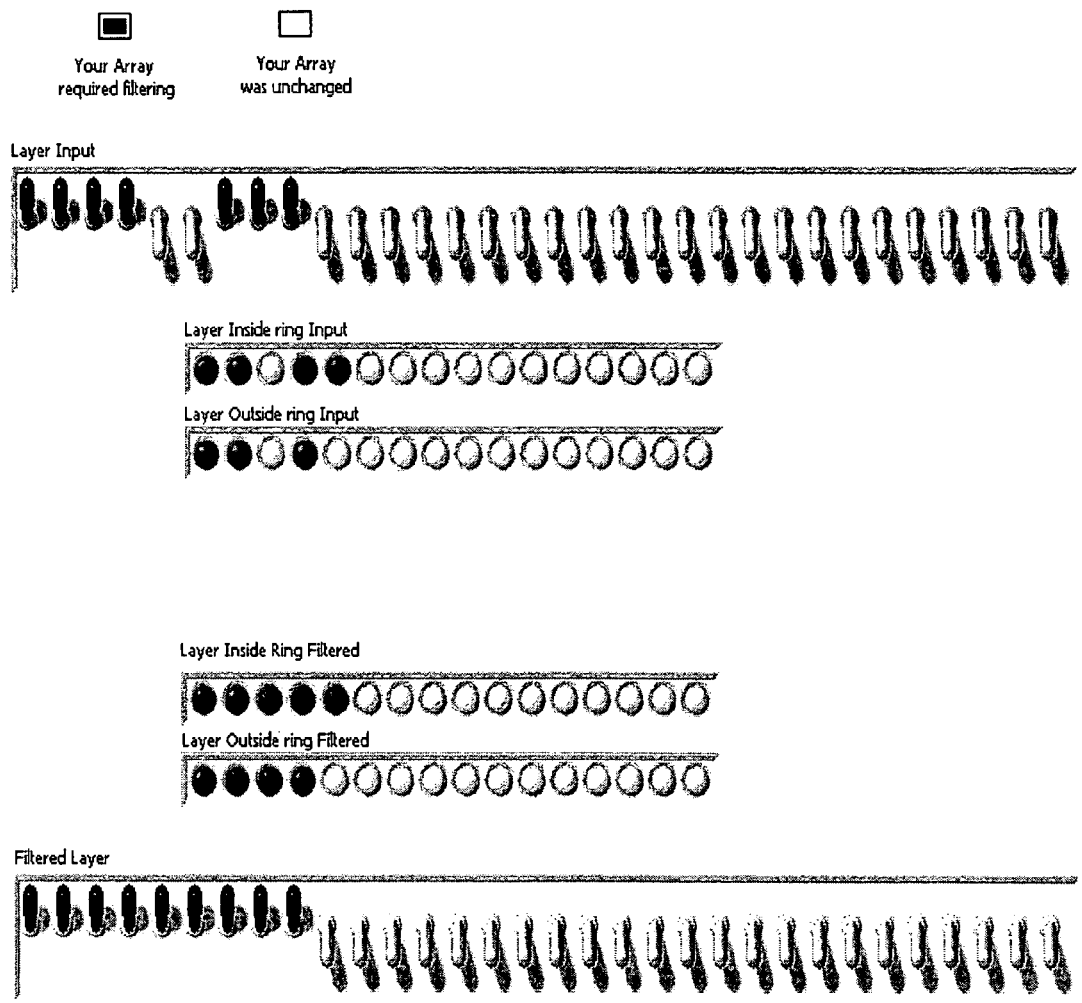
FIG. 34 is a screen print of the software program including a second cleaning step per FIG. 32.

Another form of data clean up includes the filtering of anomalous data from reasonable data. That is, a test trace may test positive in an area where no other traces are positive, or it may test negative even though most of the other traces around it are positive. For these situations, the program includes a basic data sequence recognition tool or filter that compares the input data to a reasonable pattern and corrects for anomalies. For example, in a data sequence of '01010', the filter would correct the sequence to the most probable pattern or '01110'. FIG. 34 shows a screen print of this step in the software program.

Figure 35:
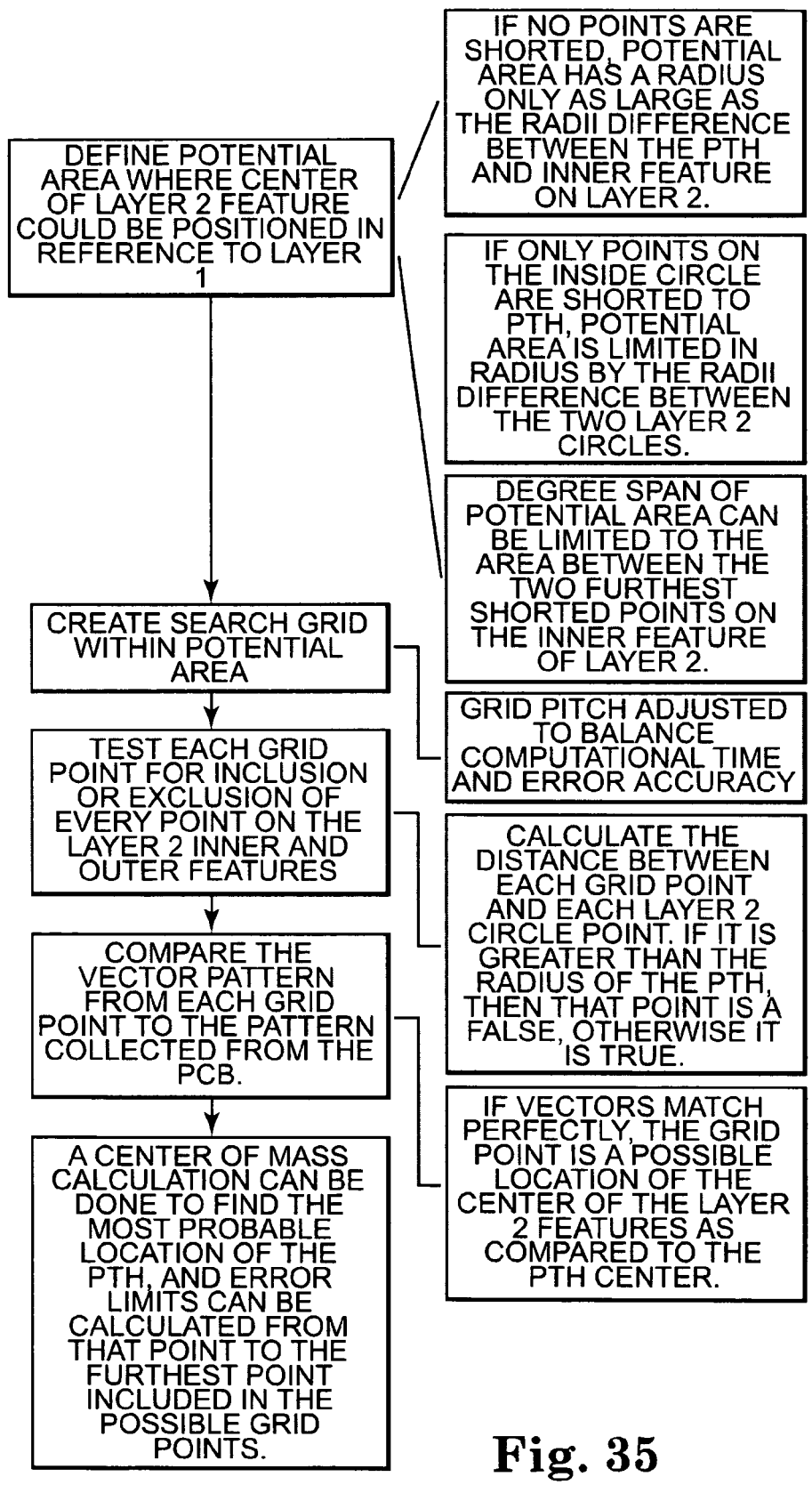
FIG. 35 is a block diagram flow chart of the software program of the present invention, including steps for manipulating the clean data to calculate misregistration.

Once the data has undergone the clean-up step, as needed, the calculation method attempts to locate the center of each intermediate layer feature or test pattern with respect to the first layer, as shown in Block 570 of FIG. 31. Based on the input data from each intermediate layer feature, certain assumptions may be made by the calculation method in order to narrow down or otherwise focus the search for, that is the location determination of, the center of each layer's feature of each test pattern. FIG. 35 shows a block diagram of the software program of the present invention including the steps of data extraction.

Figure 36:
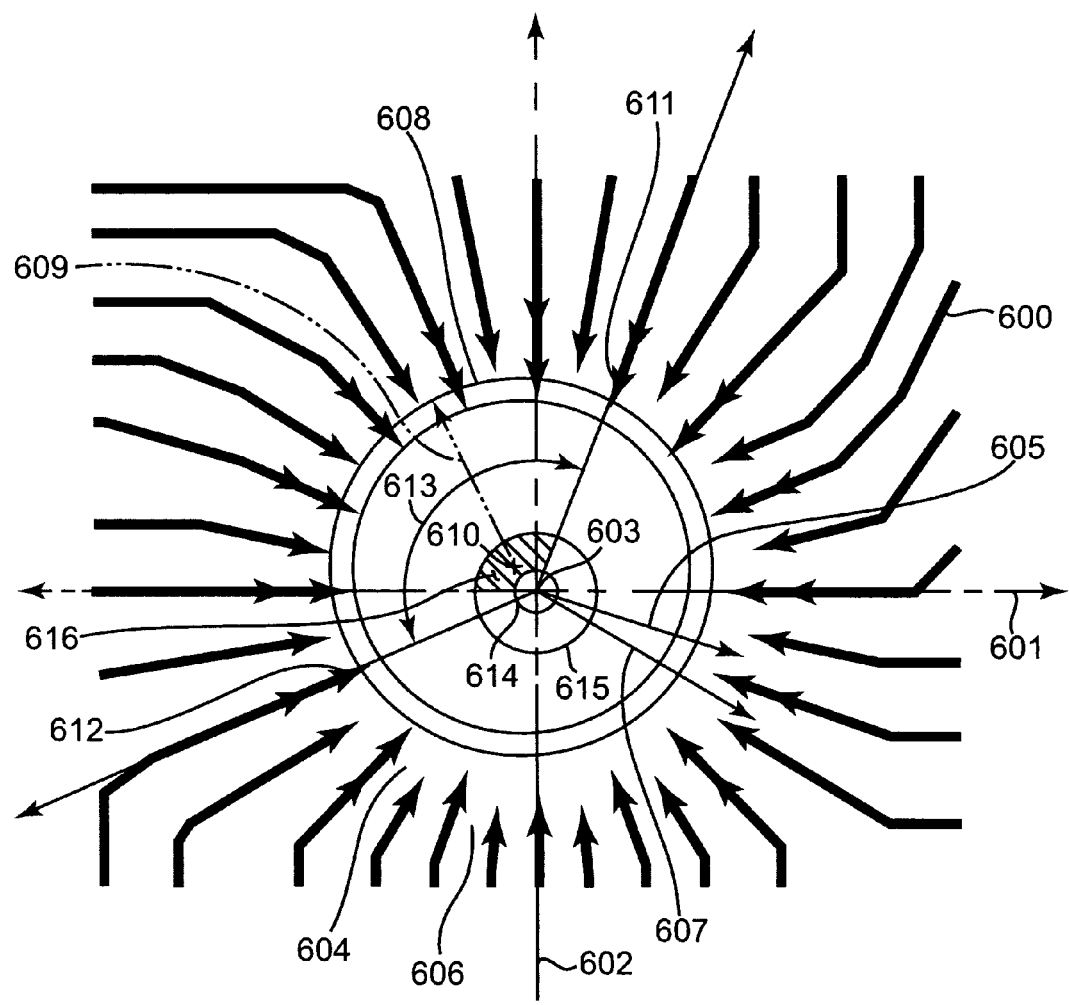
FIG. 36 is a representation of a test pattern on a misregistration PCB layer demonstrating the calculations in the steps of FIG. 35.

In one embodiment, the calculation method defines the potential area around the PTH where the center of the intermediate layer feature may be positioned based on the positive points of the test data. In FIG. 36, an intermediate layer test pattern 600 is shown laid out about X-axis 601 and Y-axis 602 whose intersection defines the center point 603. An inner circle of electrical traces 604 has a radius 605 and an outer circle of electrical traces 606 has a radius 607, both of which are centered about the center point 603. In this example, a PTH 608 having a radius 609 is drilled and plated offset from the center point 603, such that a portion of the PTH 608 overlaps some of the inner circle electrical traces 604. Each of the affected inner circle electrical traces 604 would potentially provide a positive result during the testing of the test pattern 600.

Figure 37:
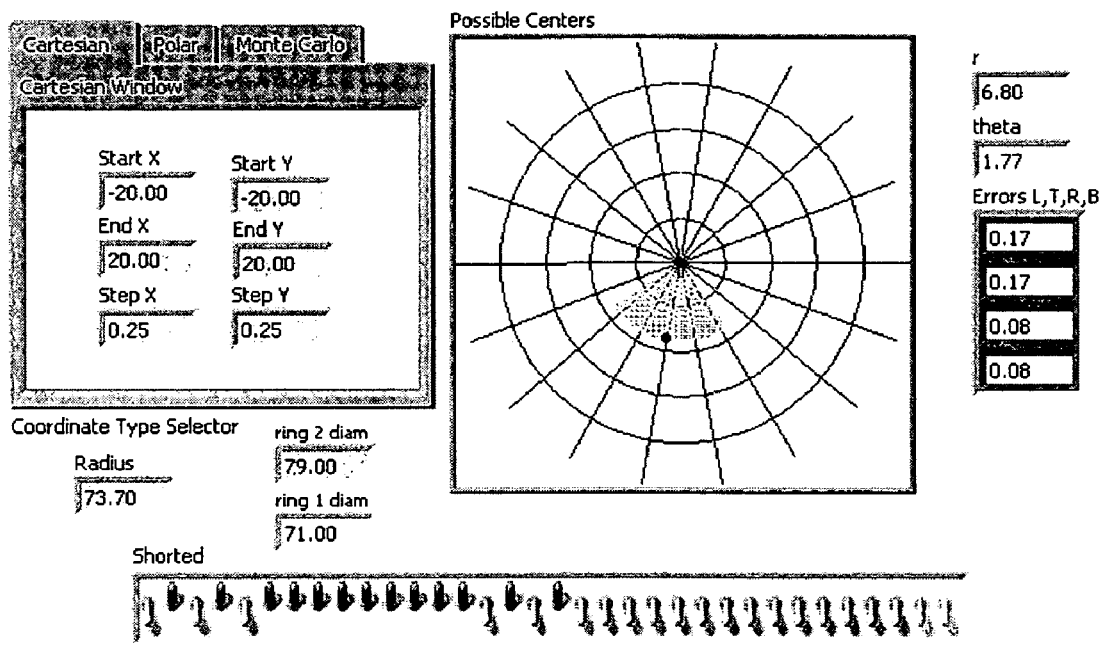
FIG. 37 is a screen print of the software program of the present invention, depicting the calculations in the steps of FIG. 35.

In order to narrow down the possible location of a theoretical center point 610 of the PTH 608, the calculation method would concentrate the search focus in the angular area between the furthermost affected electrical traces 611, 612 or the angular area defined by angle 613. In addition, the radial limits of the search area may be focused based on affected electrical traces. For example, if no electrical traces tested positive for a test pattern, the potential area location of the PTH theoretical center point 610 would only be as large as the difference between the PTH radius 609 and the inner circle radius 605. This circular area is shown by circle 614. If only traces on the inner circle 604 test positive, the potential area is limited in radius by the difference between the outer circle radius 607 and the inner circle radius 605. This circular area is shown by circle 615. The circular area may be modified in other ways in order to achieve a reliable and reasonable test result. FIG. 37 shows a screen print of this step in the software program.

In the embodiment shown, a number of inner circle electrical traces 604 are affected, so that the theoretical center point 610 potentially falls within circular area 615. In addition, the focused area is limited by angular area defined by angle 613. Therefore, between the two focusing criteria, the search area for the theoretical center point 610 is defined as shaded area 616, as shown.

Figure 38:
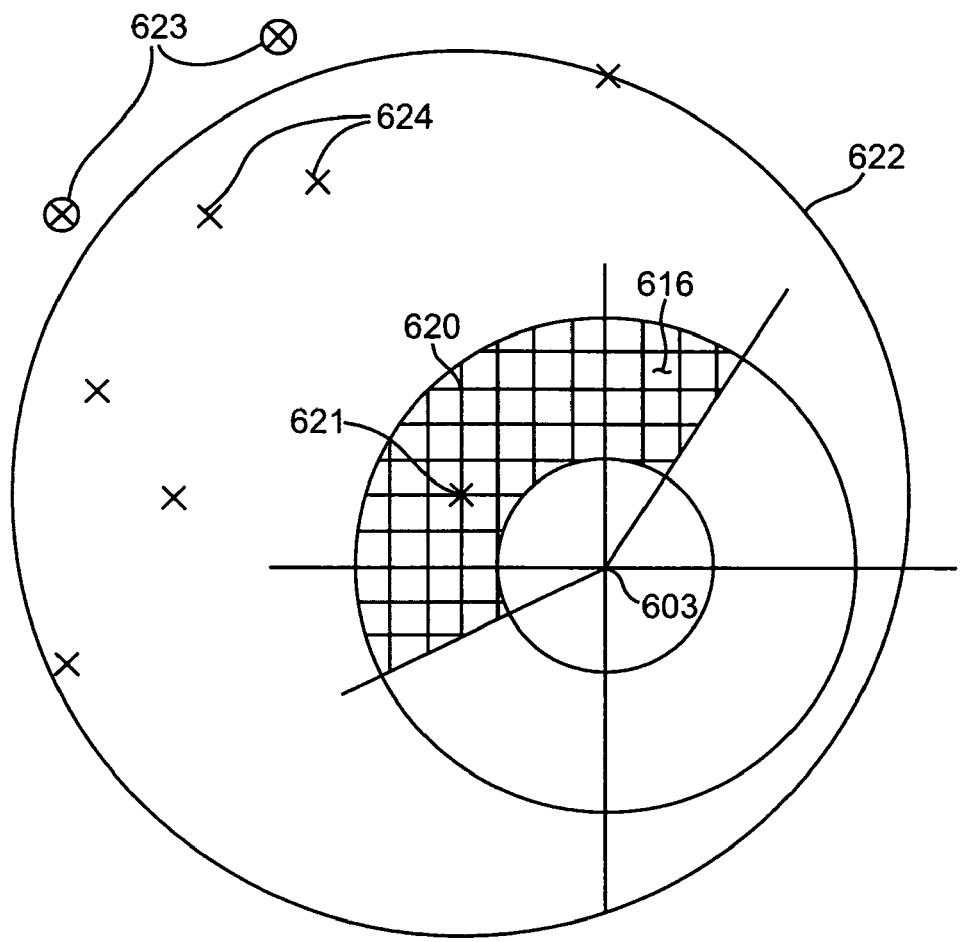
FIG. 38 is a detailed representation of a grid search performed in the steps of FIG. 35.

Once the search area 616 is determined, a search grid is created within the area 616. In FIG. 38, the area 616 is divided into a Cartesian coordinate grid 620. Other types of grids are also possible, such as polar or Monte Carlo. The grid pitch, coarse or fine, may be adjusted to balance computational time and error accuracy. That is, a finer grid structure will reduce error but will increase computational time. On the other hand, a coarse grid will take less time, but will most likely increase the error potential. Each grid point 621 is then analyzed as a potential center point of the PTH. First, each grid point 621 is set as the theoretical center point of the PTH and the theoretical PTH 622 centered at that point is laid out. Second, each test pattern positive data point 623, 624 is checked to see if it physically falls within this theoretical PTH circle 622. If not, that data point is rejected as being a false positive, i.e., points 623. Third, the potential data points that should be positive if the current theoretical center point was the correct point are determined and compared with the actual positive test points 624. If these two results agree, then the current grid point 621 is a potential center point of the PTH. If they don't agree, then the grid point is discarded.

The points of the grid are each analyzed in this same manner until all of the grid points have been checked. Usually, this analysis will result in more than one potential center point. If no results agree for any of the points of the grid, the calculation method can adjust the test circles to be smaller or larger. That is, the focus area of the search is then modified as needed to provide the potential for valid results. The analysis is then rechecked until potentially valid results are achieved.

Figure 39:
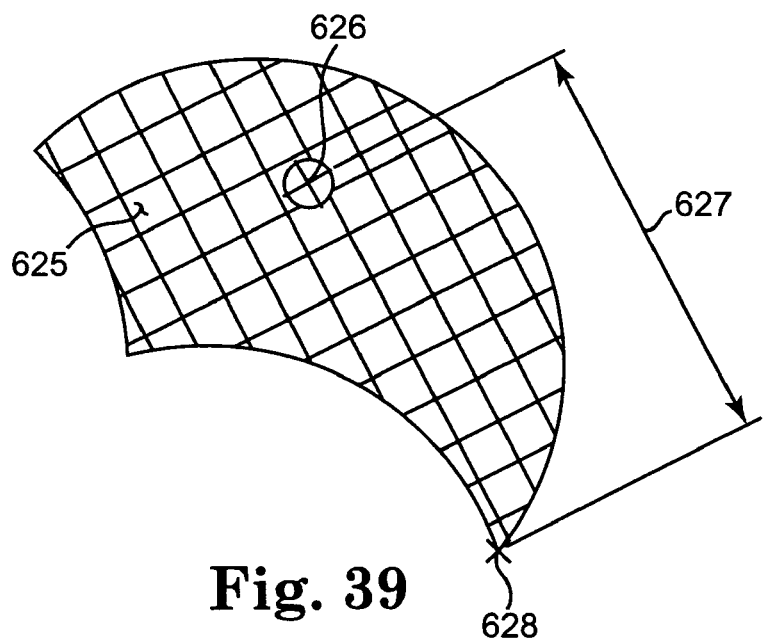
FIG. 39 is a detailed representation of a center of mass calculation performed in the steps of FIG. 35.
Figure 40:
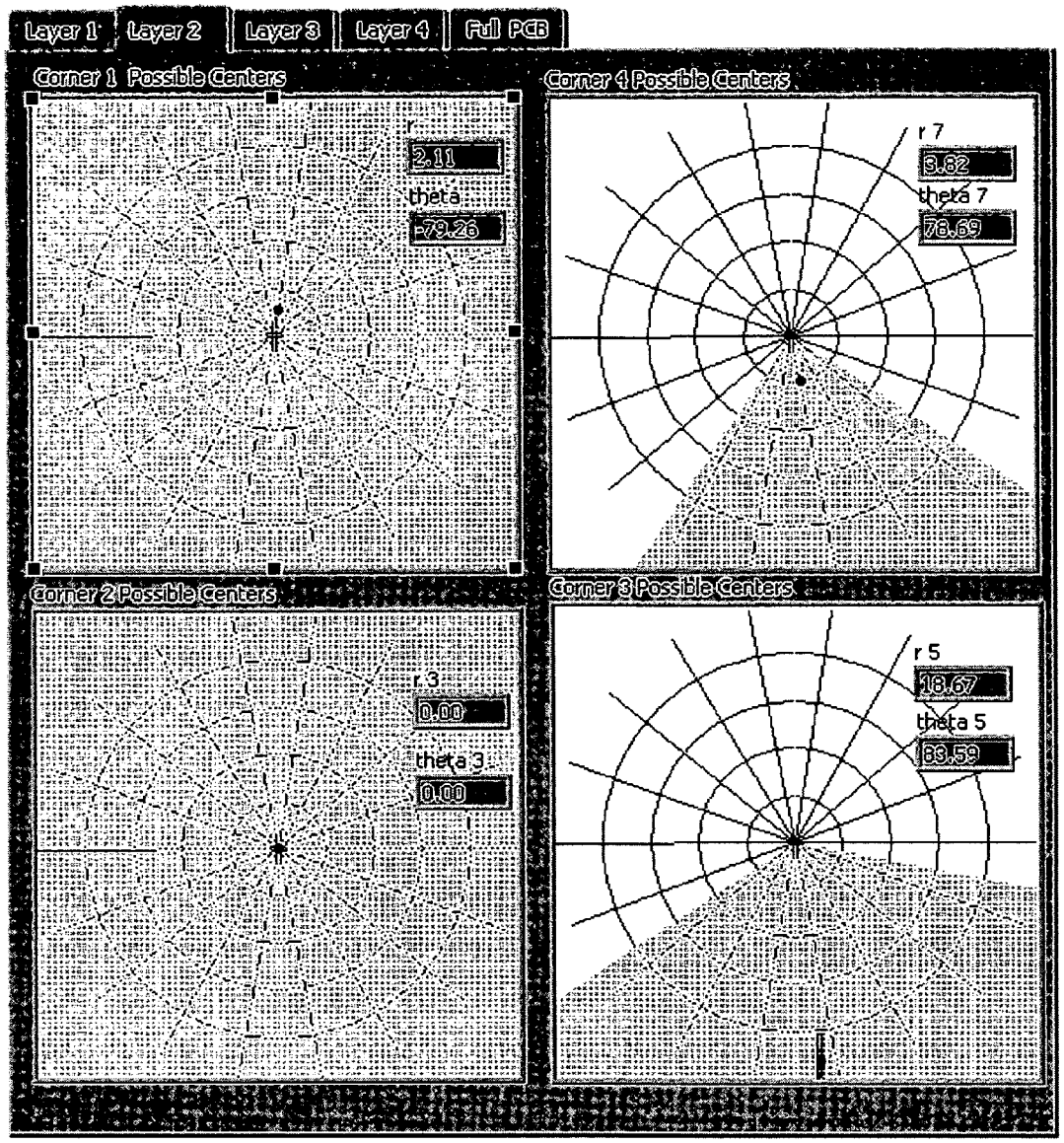
FIG. 40 is a screen print of the software program including the results of the calculations performed in the steps of FIG. 35.

Once the collection of potential center points is established, a center of mass calculation can be performed on this data to find the most probable location of the PTH center point. Error limits may also be calculated from this point, such as to the furthest point included in the collection of potential points. In FIG. 39, an area 625 representing one example of the area of location of all of the potential center points is shown. The most probable center point 626 is then calculated by a center of mass calculation. The maximum error 627 is then determined based on the distance from the most probably center point 626 to the furthest most grid point 628. The error is recorded for later reference. This analysis and calculation is repeated, as needed, for each test pattern on each layer of the PCB being tested. FIG. 40 shows a screen print of this step in the software program, including the possible centers for each of the four test patterns on Layer 2 of the tested PCB.

Figure 41:
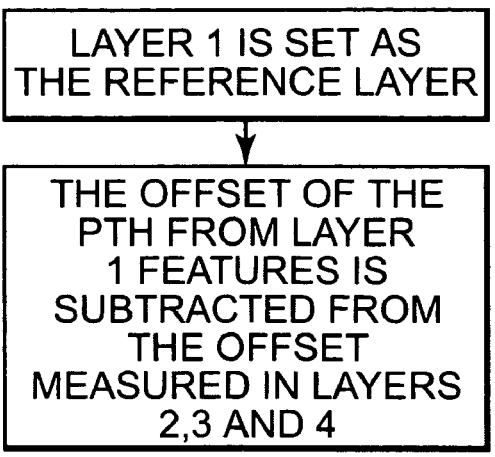
FIG. 41 is a block diagram flow chart of the software program of the present invention, including steps for adjusting the results based on the visual measurements taken on the top and bottom layers of the PCB.

Following the calculation of the most probably center point for test pattern on each layer, each set of data (center point location and error) may then be adjusted based on the measured disparities of the external top and bottom layers, as set forth above, as shown in Block 575 of FIG. 31. FIG. 41 shows a block diagram flow chart for the software program of the present invention, including the steps of adjusting the data with respect to the layer one measurements. With layer one, or the top layer, set as the reference, the offset between the actual PTH location and the layer one artwork is then subtracted from the offset calculated in the intermediate layers for each test pattern. Each test pattern is thereby normalized with respect to the first layer. For the embodiment described above having four test patterns on each layer, four final data points per layer are thus provided.

Figure 42:
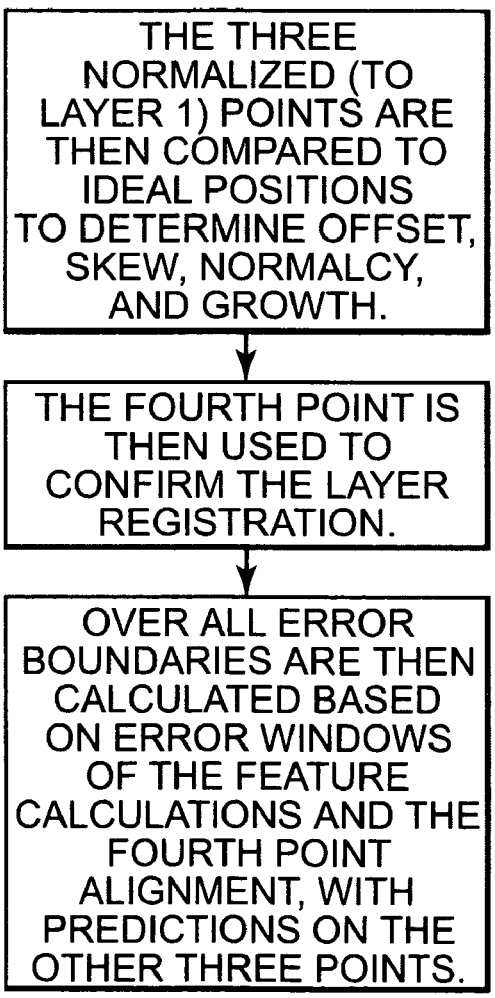
FIG. 42 is block diagram flow chart of the software program of the present invention, including steps for calculating the misregistration characteristics based on the adjusted results of the steps of FIG. 41.
Figure 43:
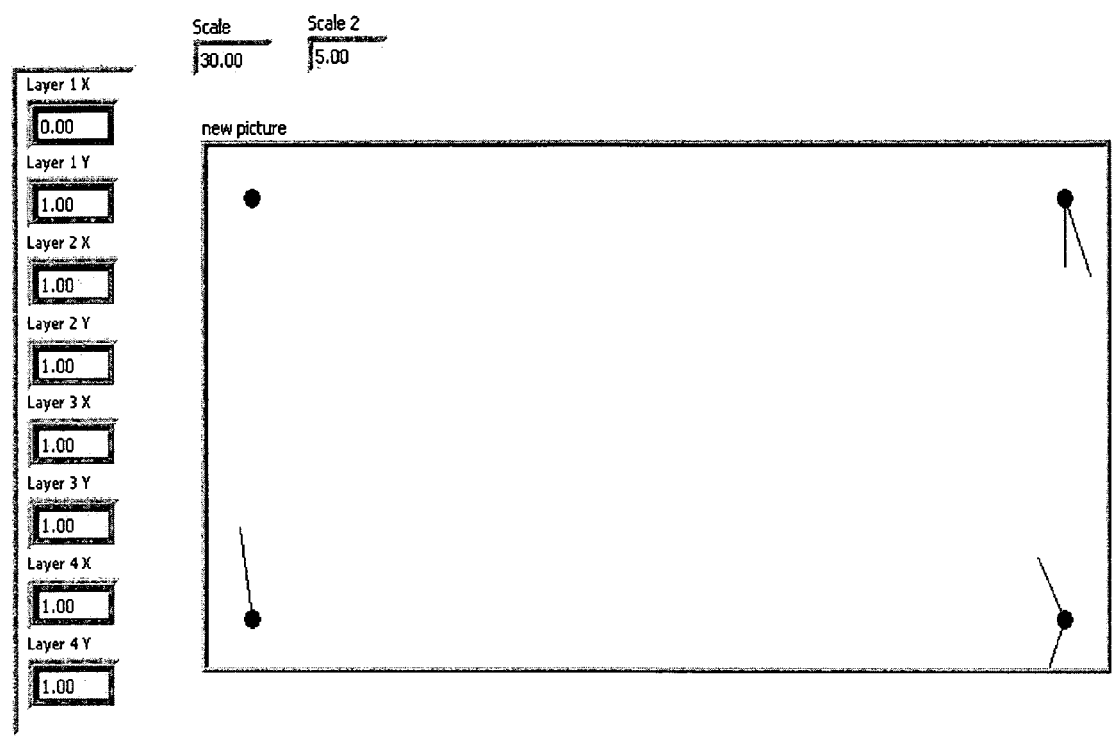
FIG. 43 is a screen print of the software program showing one embodiment of a graphical representation of the misregistration results provided by the present invention.

Finally, the registration of each intermediate layer with respect to the top layer is calculated based on the foregoing test results and calculations, as shown in Block 580 of FIG. 31. FIG. 42 shows a block diagram flow chart of the software of the present invention, including the steps of determining the misregistration based on the above described calculations. Three of the available four final data points for each layer are compared to ideal and/or theoretical positions. From this comparison, the above described characteristics of offset, skew, normalcy and growth are calculated. The available fourth final data point is then used to confirm the results of the layer registration. Overall error ranges are then calculated based on the error results for each test pattern, combined with the alignment of the fourth point with the predicted location of the other three points per layer. FIG. 43 shows a screen print of this step of the software program, providing a graphical representation of the results.

Figure 44:
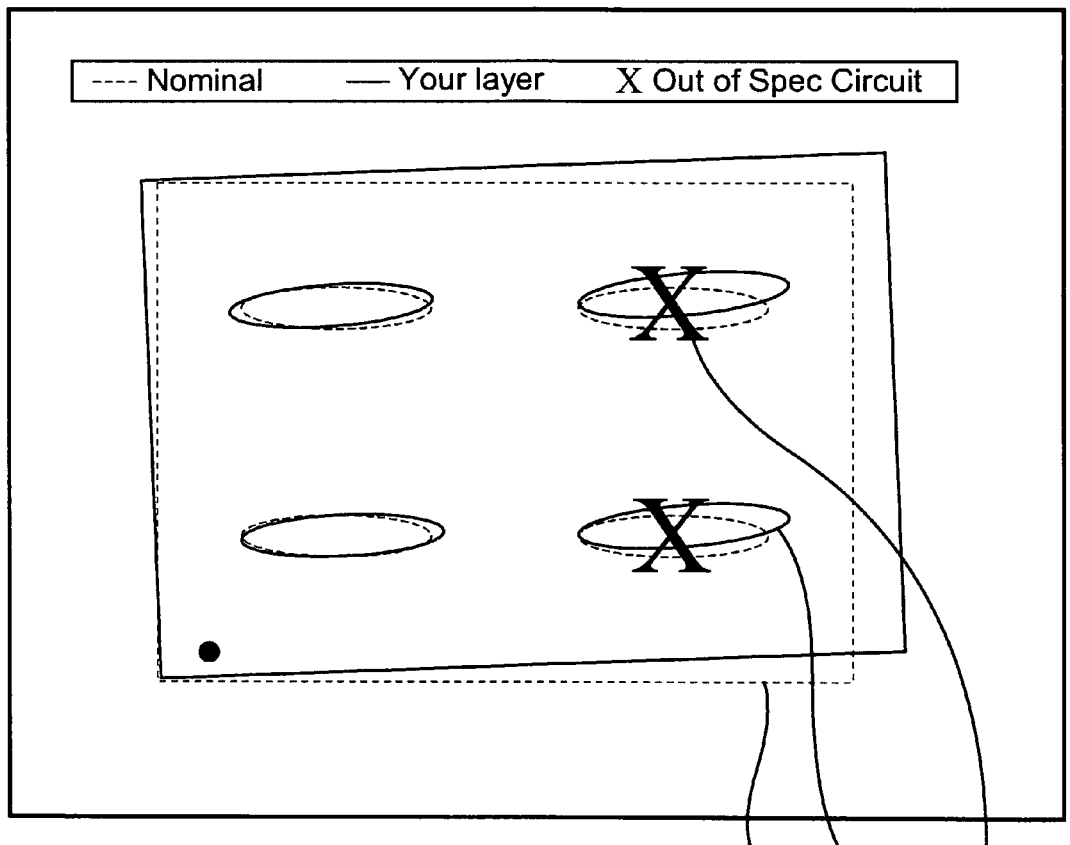
FIG. 44 is another graphical representation of test results according to the present invention depicting misregistration of a PCB layer.

These final results of offset, skew, normalcy and growth for each layer may be the desired end result of the PCB testing. Alternatively, these results may be compared to pre-determined tolerances for each particular type of PCB or PCB layout, such as is shown in Block 585 of FIG. 31. Based on this comparison, a PASS or FAIL determination may be made for each particular PCB, or area of a PCB, depending on the test pattern layout, as shown in Block 590 of FIG. 31. In FIG. 44, another graphical view of test results is shown depicting the results for four test patterns on a second layer, or Layer 2, with respect to a first or reference layer. The nominal or reference layer is shown by the dashed lines 650. The Layer 2 results are shown by the solid lines 652. Table 2 shows sample test data corresponding to this graphical result.

TABLE 2

| Test Results for Layer 2 Layer 2 | | |
| --- | --- | --- |
| Registration to Layer 1 | Measured (error) | Specification |
| Pass Offset X | 0.3 um (±0.1 um) | ≦0.5 um |
| Pass Offset Y | 0.1 um (±0.05 um) | ≦0.4 um |
| Fail Growth X | 5.1 um (±0.6 um) | ≦0.8 um |

TABLE 2-continued

| Test Results for Layer 2 Layer 2 | | |
| --- | --- | --- |
| Registration to Layer 1 | Measured (error) | Specification |
| Pass Growth Y | 0.3 um (±0.1 um) | ≦0.5 um |
| Fail Skew | 1.34° (±0.9°) | ≦0.8° |
| Pass Normalcy | 0.2° (±0.1°) | ≦0.3° |

As can be seen in Table 2, the Growth X result is greater than the specified limit and, thus, that measurement fails the test. In addition, the Skew value is also greater than the specified limit and, thus, it fails, as well. In FIG. 44, the graphical representation shows the result of these out of spec values clearly by an "X" 654 placed through the test pattern symbols that fail to meet the specified requirements.

Optionally, in Block 595 of FIG. 31, this Pass/Fail determination or the particular final test results may be utilized by the PCB manufacturing process to improve quality and reduce waste. In addition, these results may be used to set production controls and pass/fail criteria for the manufacture of subsequent PCB's. These results may increase yield by identifying good portions of a circuit board or simply good pieces of a lot and/or increase reliability by catching misaligned boards that are in danger of early via failure because of bad alignment.

The present invention provides a non-destructive method for determining layer-to-layer misregistration in a multiple layer printed circuit board. The method is usable in conjunction with a testing apparatus and a computer or other data receiving and manipulation device. Instructions are provided that may be used to interpret the testing results and to calculate both the amount and direction of any misregistration, including offset, skew, normalcy and growth. The results of the misregistration testing may then be provided in many ways, including as a pass or fail determination, a graphical depiction of the misregistration, a numerical result or as a feedback signal to a PCB manufacturing process for use in improving the quality of subsequently manufactured PCB's.

EXAMPLES

Based on a sample multiple layer board, such as that shown in FIG. 21, examples of calculations to determine layer to layer misregistration are provided below. In each of these examples, two layers are compared. The designed centers of the four PTH's 493 and four test patterns 492 are compared to the measured centers of the four test patterns 492 on Layer 1 and the measured center of the four PTH's 493 on Layer 1. The offset between the center of the test pattern on Layer 2 and the PTH was determined by the method of the present invention, as set forth above.

The data is displayed as follows:

Designed centers of PTH and test pattern=$[d_0,d_1,d_2,d_3]$

Measured centers of test pattern on Layer 1=$[m_0^{l1},m_1^{l1},m_2^{l1},m_3^{l1}]$ Measured centers of PTH on Layer 1=$[m_0^p,m_1^p,m_2^p,m_3^p]$ Electronically collected and calculated offset between center of test pattern on Layer 2 and PTH=$[m_{o0}^{l2},m_{o1}^{l2},m_{o2}^{l2},m_{o3}^{l2}]$

Example 1

In the first example, the two layers of the board are aligned, with no growth, shrinkage, skew, normalcy or layer to layer offset problems. However, as shown in the data, the test pattern center and PTH aren't perfectly aligned.

Designed centers $[d_0,d_1,d_2,d_3]$: (0,0),(0,8),(8,0),(8,8)

Measured centers of Layer 1 test pattern $[m_0^{l1},m_1^{l1},m_2^{l1},m_3^{l1}]$: (0,0),(0,8),(8,0),(8,8)

Measured centers of Layer 1 PTH $[m_0^P,m_1^P,m_2^P,m_3^P]$: (0.1, 0.1),(0.1,8.1),(8.1,0.1),(8.1,8.1)

Electronically collected and calculated information on offset of test pattern center on Layer 2 and PTH $[m_{o0}^{l2},m_{o1}^{l2},m_{o2}^{l2},m_{o3}^{l2}]$, (−0.1,−0.1), (−0.1,−0.1) (−0.1,−0.1), (−0.1,−0.1)

Sample Calculation of Layer 1 Growth/Shrinkage:

$$G = |m_x^{l1}| - |d_x|$$

$$Sqrt(8^2+0^2) - Sqrt(8^2+0^2) = 0$$

No growth or shrinkage in x direction $$Sqrt(0^2+8^2) - Sqrt(0^2+8^2) = 0$$

No growth or shrinkage in y direction

Sample Calculation of Layer 2 Growth/Shrinkage:

$$Sqrt((8.1-0.1)^2+(0.1-0.1)^2) - Sqrt(8^2+0^2) = 0$$

No growth or shrinkage in x direction $$Sqrt((0.1-0.1)^2+(8.1-0.1)^2) - Sqrt(0^2+8^2) = 0$$

No growth or shrinkage in y direction

Sample calculation of Layer 1 Normalcy:

$$\theta = \arccos\left(\frac{|m_2^{l1} \cdot m_3^{l1}|}{|m_2^{l1}| \cdot |m_3^{l1}|}\right)$$

$$\arccos((8*0+0*8)/(Sqrt(8^2+0^2)*Sqrt(0^2+8^2))) = \pi/2$$

Layer 1 Is perfectly normal

Sample calculation of Layer 2 Normalcy:

$$\arccos(((0.1-0.1)*(8.1-0.1)+(8.1-0.1)*(0.1-0.1))/(Sqrt((8.1-0.1)^2+(0.1-0.1)^2)*Sqrt((0.1-0.1)^2+(8.1-0.1)^2))) = \pi/2$$

Layer 2 Is perfectly normal

Sample Calculation Example: Layer 1 to Layer 2 Offset $$\Delta^{l1,l2} = m_0^{l1} - (m_0^P + m_{oo}^{l2})$$

$$(0,0) - ((0.1,0.1) + (-0.1,-0.1)) = (0,0)$$

Zero Offset

Sample Calculation Example: Layer 1 to Layer 2 Skew $$\theta = \arccos\left(\frac{|(m_2^P + m_{o2}^{l2} - \Delta^{l1,l2}) \cdot m_2^{l1}|}{|m_2^P + m_{o2}^{l2} - \Delta^{l1,l2}| \cdot |m_2^{l1}|}\right)$$

$$\arccos(((0.1-0.1)*0+(8.1-0.1)*8)/(Sqrt(8^2+0^2)*Sqrt((8.1-0.1)^2+(0.1-0.1)^2))) = 0$$

No skew between layer 1 and layer 2

Example 2

In the second example, the two layers are aligned, but with growth in the x direction, shrinkage in the y direction, no skew, normalcy problems nor offset center problems.

Designed centers $[d_0,d_1,d_2,d_3]$: (0,0),(0,8),(8,0),(8,8)

Measured centers of Layer 1 test pattern $[m_0^{l1},m_1^{l1},m_2^{l1},m_3^{l1}]$: (0,0),(0,8),(8,0),(8,8)

Measured centers of Layer 1 PTH $[m_0^P,m_1^P,m_2^P,m_3^P]$: (0.1, 0.1),(0.1,8.1),(8.1,0.1),(8.1,8.1)

Electronically collected and calculated information on offset of test pattern center on Layer 2 and PTH $[m_{o0}^{l2},m_{o1}^{l2},m_{o2}^{l2},m_{o3}^{l2}]$: (−0.1,−0.1), (−0.1,−1.1), (0.9,−0.1), (0.9,−1.1)

Sample Calculation of Layer 1 Growth/Shrinkage:

$$Sqrt(8^2+0^2) - Sqrt(8^2+0^2) = 0$$

No growth or shrinkage in x direction $$Sqrt(0^2+8^2) - Sqrt(0^2+8^2) = 0$$

No growth or shrinkage in y direction

Sample Calculation of Layer 2 Growth/Shrinkage:

$$Sqrt((8.1+0.9)^2+(0.1-0.1)^2) - Sqrt(8^2+0^2) = 1$$

Growth in x direction $$Sqrt((0.1-0.1)^2+(8.1-1.1)^2) - Sqrt(0^2+8^2) = -1$$

Shrinkage in y direction

Sample Calculation of Layer 1 Normality:

$$\arccos((8*0+0*8)/(Sqrt(8^2+0^2)*Sqrt(0^2+8^2))) = \pi/2$$

Layer 1 Is perfectly normal

Sample calculation of Layer 2 Normality:

$$\arccos(((0.1-0.1)*(8.1+0.9)+(8.1-1.1)*(0.1-0.1))/(Sqrt((8.1+0.9)^2+(0.1-0.1)^2)*Sqrt((0.1-0.1)^2+(8.1-1.1)^2))) = \pi/2$$

Layer 2 Is perfectly normal

Sample Calculation Example: Layer 1 to Layer 2 Offset $$(0,0) - ((0.1,0.1) + (-0.1,-0.1)) = (0,0)$$

Zero Offset

Sample Calculation Example: Layer 1 to Layer 2 Skew $$\arccos(((0.1-0.1)*0+(8.1-1.1)*8)/(Sqrt(8^2+0^2)*Sqrt((8.1-1.1)^2+(0.1-0.1)^2))) = 0$$

No skew between layer 1 and layer 2

Example 3

In the third example, the two layers have no normalcy nor skew problems, but show growth/shrinkage in Layer 2 and offset in both the x and y directions.

Designed centers $[d_0,d_1,d_2,d_3]$: (0,0),(0,8),(8,0),(8,8)

Measured centers of Layer 1 test pattern $[m_0^{l1},m_1^{l1},m_2^{l1},m_3^{l1}]$: (0,0),(0,8),(8,0),(8,8)

Measured centers of Layer 1 PTH $[m_0^P,m_1^P,m_2^P,m_3^P]$: (0.1, 0.1),(0.1,8.1),(8.1,0.1),(8.1,8.1)

Electronically collected and calculated information on offset of test pattern center on Layer 2 and PTH [$m_{o0}^{l2}$, $m_{o1}^{l2}$, $m_{o2}^{l2}$, $m_{o3}^{l2}$]: (0.9,0.9), (0.9,–0.1), (1.9,0.9), (1.9,–0.1)

Sample Calculation of Layer 1 Growth/Shrinkage:

$$\text{Sqrt}(8^2+0^2)-\text{Sqrt}(8^2+0^2)=0$$

No growth or shrinkage in x direction $$\text{Sqrt}(0^2+8^2)-\text{Sqrt}(0^2+8^2)=0$$

No growth or shrinkage in y direction

Sample Calculation of Layer 2 Growth/Shrinkage:

$$\text{Sqrt}(((8.1+1.9)-(0.1+0.9))^2+((0.1+0.9)-(0.1+0.9))^2)-\text{Sqrt}(8^2+0^2)=1$$

Growth in x direction $$\text{Sqrt}(((0.1+0.9)-(0.1+0.9))^2+((8.1-0.1)-(0.1+0.9))^2)-\text{Sqrt}(0^2+8^2)=-1$$

Shrinkage in y direction

Sample Calculation of Layer 1 Normality:

$$\arccos((8*0+0*8)/(\text{Sqrt}(8^2+0^2)*\text{Sqrt}(0^2+8^2)))=\pi/2$$

Layer 1 Is perfectly normal

Sample Calculation of Layer 2 Normality:

$$\arccos((((0.1+0.9)-(0.1+0.9))*((8.1+1.9)-(0.1+0.9))+((8.1-0.1)-(0.1+0.9))*((0.1+0.9)-(0.1+0.9)))/(\text{Sqrt}(((8.1+1.9)-(0.1+0.9))^2+((0.1+0.9)-(0.1+0.9))^2)*\text{Sqrt}(((0.1+0.9)-(0.1+0.9))^2+((8.1-0.1)-(0.1+0.9))^2))=\pi/2$$

Layer 2 Is perfectly normal

Sample Calculation Example: Layer 1 to Layer 2 Offset $$(0,0)-((0.1,0.1)+(0.9,0.9))=(1,1)$$

Offset in x and y direction

Sample Calculation Example: Layer 1 to Layer 2 Skew $$\arccos((((0.1+0.9)-(0.1+0.9))*0+((8.1-0.1)-(0.1+0.9))*8)/(\text{Sqrt}(8^2+0^2)*\text{Sqrt}(((8.1-0.1)-(0.1+0.9))^2+((0.1+0.9)-(0.1+0.9))^2)))=0$$

No skew between layer 1 and layer 2

Although the present invention has been described with reference to many embodiments, persons skilled in the art will recognize that changes may be made in form and detail without departing from the spirit and scope of the invention.

We claim:

1. A method of manufacturing a multiple layer printed circuit board configured to facilitate testing of layer-to-layer misregistration, the method comprising the steps of:

forming a plurality of electrical test traces extending from near a through-hole site on a first layer, a first end of each of the plurality of electrical test traces located adjacent the through-hole site and a second end of each of the plurality of electrical test traces located away from the through-hole site, wherein at least two of the plurality of electrical test traces are electrically isolated from each other;

forming an electrically conductive connecting pathway between the first layer and a second layer at the through-hole site;

forming a plurality of electrical test references on the second layer corresponding to the plurality of electrical test traces;

connecting the plurality of electrical test traces with the plurality of electrical test references such that each of the plurality of electrical test references is singly conductively connected to a corresponding one of the plurality of electrical test traces;

testing for an electrical continuity between the electrically conductive connecting pathway and each of the plurality of electrical test references; and determining layer-to-layer misregistration of the first layer with respect to the second layer based on the electrical continuity.

2. The method of claim 1, wherein forming the plurality of electrical test traces comprises forming a plurality of trace pads, each of the plurality of trace pads generally positioned at the second end of each of the plurality of electrical test traces; and wherein forming the plurality of electrical test references comprises forming a plurality of probe pads located to correspond generally to the plurality of trace pads.

3. The method of claim 2, wherein connecting the plurality of electrical test traces with the plurality of electrical test references comprises connecting the plurality of trace pads with the plurality of probe pads such that each of the plurality of probe pads is singly conductively connected to a corresponding one of the plurality of trace pads.

4. The method of claim 2, wherein forming the plurality of trace pads and forming the plurality of probe pads comprises positioning the plurality of trace pads and the plurality of probe pads in an orderly pattern to facilitate testing of the electrical continuity.

5. The method of claim 1, wherein forming the plurality of electrical test references comprises locating the plurality of electrical test references on an outer layer of the printed circuit board and wherein forming the plurality of electrical test traces comprises locating the plurality of electrical test traces on an inner layer of the printed circuit board.

6. The method of claim 1, wherein the plurality of electrical test traces is a first plurality of electrical test traces, the method further comprising forming a second plurality of electrical test traces on a third layer of the multiple layer printed circuit board and wherein forming the plurality of electrical test references on the second layer comprises forming the plurality of electrical test references on the second layer corresponding to the first and second pluralities of electrical test traces.

7. The method of claim 1, further comprising forming one or more additional pluralities of electrical test traces on the first layer, forming one or more additional corresponding pluralities of electrical test references on the second layer, and connecting the one or more additional pluralities of electrical test traces with the one or more additional corresponding pluralities of electrical test references such that each electrical test trace of the one or more additional pluralities of electrical test traces is singly conductively connected to a corresponding one electrical test reference of the one or more additional corresponding pluralities of electrical test references.

8. A method for testing of layer-to-layer misregistration in a multiple layer printed circuit board, the method comprising:

forming a first conductive test trace extending from near a through-hole site on a first layer of the board;

forming a second conductive test trace extending from near the through-hole site on the first layer;

forming a first electrical test reference on a second layer of the board and conductively connecting the first electrical test reference to the first conductive test trace;

forming a second electrical test reference on the second layer and conductively connecting the second electrical test reference to the second conductive test trace;

placing a plated through-hole through the first layer and the second layer;

testing for electrical continuity between the plated through-hole and the first electrical test reference and between the plated through-hole and the second electrical test reference; and determining misregistration between the first layer and the second layer based on the testing.

9. The method of claim 8, wherein the plated through-hole and the through hole site are of adequate dimensions to permit the plated through-hole to pass through the through-hole site without intersecting the first or second conductive test traces when the first layer is not misregistered with respect to the second layer.

10. The method of claim 8, wherein determining misregistration comprises determining a presence of misregistration.

11. The method of claim 8, further comprising:
forming a third conductive test trace extending from near the through-hole site on the first layer; and
forming a third electrical test reference on the second layer and conductively connecting the third electrical test reference to the third conductive test trace,
wherein testing for electrical continuity further comprises testing for electrical continuity between the plated through-hole and the third electrical test reference, and
wherein determining misregistration comprises determining a direction of misregistration based on the testing.

12. The method of claim 8, further comprising:
forming a third conductive test trace extending from near the through-hole site on the first layer;
forming a third electrical test reference on the second layer and conductively connecting the third electrical test reference to the third conductive test trace,
forming a fourth conductive test trace extending from near the through-hole site on the first layer; and
forming a fourth electrical test reference on the second layer and conductively connecting the fourth electrical test reference to the fourth conductive test trace,
wherein each of the first, second, third, and fourth conductive test traces comprises an inner end toward the through-hole site and an outer end away from the through-hole site, the inner ends of the third and fourth conductive test traces further from the through-hole site than the inner ends of the first and second conductive test traces,
wherein testing for electrical continuity further comprises testing for electrical continuity between the plated through-hole and the third electrical test reference and between the plated through-hole and the fourth electrical test reference, and
wherein determining misregistration comprises determining a degree of misregistration based on the testing.

13. The method of claim 8, wherein the first electrical test reference is a probe pad.

14. The method of claim 8, further comprising:
forming a third electrical test reference on the second layer and conductively connecting the third electrical test reference to the plated through-hole,
wherein testing for electrical continuity between the plated through-hole and the first electrical test reference and between the plated through-hole and the second electrical test reference comprises testing for electrical continuity between the third electrical test reference and the first electrical test reference and between the third electrical test reference and the second electrical test reference.

15. The method of claim 14, wherein the third electrical test reference is a probe pad.

16. The method of claim 8, wherein the through-hole site is a first through-hole site, the method further comprising:
forming a third conductive test trace extending from near a second through-hole site on a third layer of the board;
forming a third electrical test reference and conductively connecting the third electrical test reference to the third conductive test trace; and
placing the plated through-hole through the second layer and through the first layer at the first through-hole site and through the third layer at the second through-hole site,
wherein testing for electrical continuity further comprises testing for electrical continuity between the plated through-hole and the third electrical test reference, and
wherein determining misregistration further comprises determining misregistration between the third layer and the second layer based on the testing.

17. The method of claim 16, wherein the third electrical test reference is on the second layer.

18. The method of claim 8, wherein the through-hole site is a first through-hole site, and wherein the plated through-hole is a first plated through-hole, the method further comprising:
forming a third conductive test trace extending from near a second through-hole site on the first layer;
forming a fourth conductive test trace extending from near a third through-hole site on the first layer;
forming a third electrical test reference and conductively connecting the third electrical test reference to the third conductive test trace;
forming a fourth electrical test reference and conductively connecting the fourth electrical test reference to the fourth conductive test trace;
placing the first plated through-hole through the first layer and the second layer at the first through-hole site;
placing a second plated through-hole through the first layer and the second layer at the second through-hole site;
placing a third plated through-hole through the first layer and the second layer at the third through-hole site;
testing for electrical continuity between the second plated through-hole and the third electrical test reference; and
testing for electrical continuity between the third plated through-hole and the fourth electrical test reference,
wherein determining misregistration between the first layer and the second layer based on the testing comprises calculating one or more of an offset, a skew, a normalcy, and a growth.

19. The method of claim 18, wherein the third electrical test reference and the fourth electrical test reference are on the second layer.

20. The method of claim 8, wherein the first layer is an inner layer of the multiple layer board, and wherein the second layer is an outer layer of the multiple layer board.

21. A method of manufacturing a multiple layer printed circuit board configured to facilitate testing of layer-to-layer misregistration, the method comprising the steps of:
forming a plurality of electrical test traces extending from near a through-hole site on a first layer, a first end of each of the plurality of electrical test traces located adjacent the through-hole site and a second end of each of the plurality of electrical test traces located away from the through-hole site;

forming an electrically conductive connecting pathway between the first layer and a second layer at the through-hole site;

forming a plurality of electrical test references on the second layer corresponding to the plurality of electrical test traces;

connecting the plurality of electrical test traces with the plurality of electrical test references such that each of the plurality of electrical test references is singly conductively connected to a corresponding one of the plurality of electrical test traces;

testing for an electrical continuity between the electrically conductive connecting pathway and each of the plurality of electrical test references; and determining layer-to-layer misregistration of the first layer with respect to the second layer based on the electrical continuity.

22. The method of claim 21, wherein forming the plurality of electrical test traces comprises forming a plurality of trace pads, each of the plurality of trace pads generally positioned at the second end of each of the plurality of electrical test traces; and wherein forming the plurality of electrical test references comprises forming a plurality of probe pads located to correspond generally to the plurality of trace pads.

23. The method of claim 22, wherein connecting the plurality of electrical test traces with the plurality of electrical test references comprises connecting the plurality of trace pads with the plurality of probe pads such that each of the plurality of probe pads is singly conductively connected to a corresponding one of the plurality of trace pads.

24. The method of claim 22, wherein forming the plurality of trace pads and forming the plurality of probe pads comprises positioning the plurality of trace pads and the plurality of probe pads in an orderly pattern to facilitate testing of the electrical continuity.

25. The method of claim 21, wherein forming the plurality of electrical test references comprises locating the plurality of electrical test references on an outer layer of the printed circuit board and wherein forming the plurality of electrical test traces comprises locating the plurality of electrical test traces on an inner layer of the printed circuit board.

26. The method of claim 21, wherein the plurality of electrical test traces is a first plurality of electrical test traces, the method further comprising forming a second plurality of electrical test traces on a third layer of the multiple layer printed circuit board and wherein forming the plurality of electrical test references on the second layer comprises forming the plurality of electrical test references on the second layer corresponding to the first and second pluralities of electrical test traces.

27. The method of claim 21, further comprising forming one or more additional pluralities of electrical test traces on the first layer, forming one or more additional corresponding pluralities of electrical test references on the second layer, and connecting the one or more additional pluralities of electrical test traces with the one or more additional corresponding pluralities of electrical test references such that each electrical test trace of the one or more additional pluralities of electrical test traces is singly conductively connected to a corresponding one electrical test reference of the one or more additional corresponding pluralities of electrical test references.

* * * * *